US012058870B2

(12) United States Patent
Yeong et al.

(10) Patent No.: US 12,058,870 B2
(45) Date of Patent: Aug. 6, 2024

(54) HIGH DENSITY 3D FERAM

(71) Applicant: Taiwan Semiconductor Manufacturing Co., Ltd., Hsinchu (TW)

(72) Inventors: Sai-Hooi Yeong, Hsinchu County (TW); Bo-Feng Young, Hsinchu (TW); Yu-Ming Lin, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 195 days.

(21) Appl. No.: 17/868,278

(22) Filed: Jul. 19, 2022

(65) Prior Publication Data

US 2022/0352208 A1 Nov. 3, 2022

Related U.S. Application Data

(62) Division of application No. 17/106,516, filed on Nov. 30, 2020, now Pat. No. 11,450,686.

(Continued)

(51) Int. Cl.
*H10B 51/20* (2023.01)
*H01L 21/28* (2006.01)
(Continued)

(52) U.S. Cl.
CPC ........ *H10B 51/20* (2023.02); *H01L 29/40111* (2019.08); *H01L 29/78391* (2014.09);
(Continued)

(58) Field of Classification Search
CPC ........ H10B 51/00; H10B 51/10; H10B 51/20; H10B 51/30; H01L 29/40111;
(Continued)

(56) References Cited

U.S. PATENT DOCUMENTS 8,599,616 B2 * 12/2013 Roizin ............... G11C 16/0416
438/211
10,535,659 B2  1/2020 Kim
(Continued)

FOREIGN PATENT DOCUMENTS

CN 102623385 A * 8/2012
CN 104115273 A * 10/2014 ............. B82Y 10/00
(Continued)

*Primary Examiner* — Matthew E Warren
(74) *Attorney, Agent, or Firm* — Haynes and Boone, LLP

(57) ABSTRACT

A method includes forming a stack of multi-layers, each multi-layer including a first isolation layer, a semiconductor layer, and a first metal layer; etching the stack of multi-layers to form gate trenches in a channel region; removing the first isolation layers and the first metal layers from the channel region, resulting in channel portions of the semiconductor layers exposed in the gate trenches; laterally recessing the first metal layers from the gate trenches, resulting in gaps between adjacent layers of the first isolation layers and the semiconductor layers; forming an inner spacer layer in the gaps; forming a ferroelectric (FE) layer surrounding each of the channel portions and over sidewalls of the gate trenches, wherein the inner spacer layer is disposed laterally between the FE layer and the first metal layers; and depositing a metal gate layer over the FE layer and filling the gate trenches.

20 Claims, 25 Drawing Sheets

Related U.S. Application Data

(60) Provisional application No. 63/045,631, filed on Jun. 29, 2020.

(51) Int. Cl.
  *H01L 29/78*   (2006.01)
  *H01L 29/786*  (2006.01)
  *H10B 51/00*   (2023.01)
  *H10B 51/10*   (2023.01)
  *H10B 51/30*   (2023.01)

(52) U.S. Cl.
  CPC ...... *H01L 29/785* (2013.01); *H01L 29/78696* (2013.01); *H10B 51/00* (2023.02); *H10B 51/10* (2023.02); *H10B 51/30* (2023.02)

(58) Field of Classification Search
  CPC ............ H01L 29/78391; H01L 29/785; H01L 29/7858; H01L 29/78696
  See application file for complete search history.

(56) References Cited

U.S. PATENT DOCUMENTS

| | | |
|---|---|---|
| 2013/0026553 A1 | 1/2013 | Horch |
| 2016/0005873 A1 | 1/2016 | Jintyou et al. |
| 2017/0162702 A1 | 6/2017 | Hu |
| 2018/0350685 A1 | 12/2018 | Or-Bach |
| 2018/0350994 A1 | 12/2018 | Hosaka et al. |
| 2019/0355738 A1 | 11/2019 | Zhao et al. |
| 2020/0013870 A1 | 1/2020 | Ha |
| 2020/0035696 A1 | 1/2020 | Zhu |
| 2020/0075770 A1 | 3/2020 | Kobrinksy |
| 2020/0168715 A1 | 5/2020 | Wu |
| 2020/0194416 A1* | 6/2020 | Or-Bach ................ H10B 41/35 |
| 2021/0242239 A1* | 8/2021 | Lin ........................ H10B 51/20 |
| 2021/0273113 A1 | 9/2021 | Chang et al. |
| 2021/0398989 A1* | 12/2021 | Lin ................... H01L 29/66833 |
| 2021/0408227 A1* | 12/2021 | O'Brien ............ H01L 29/42392 |
| 2021/0408289 A1* | 12/2021 | Guha ................... H01L 29/0847 |

FOREIGN PATENT DOCUMENTS

| | | | |
|---|---|---|---|
| CN | 104115273 A | 10/2014 | |
| CN | 108475697 A | 8/2018 | |
| KR | 20200003737 A | 1/2020 | |
| KR | 20200005417 A | 1/2020 | |
| KR | 20200037083 A | 4/2020 | |
| KR | 20210148827 A | 12/2021 | |
| TW | 201308522 A | 2/2013 | |
| TW | 201712906 A | 4/2017 | |
| TW | 201904022 A | 1/2019 | |
| TW | 201919129 A | 5/2019 | |
| TW | 201926576 A | 7/2019 | |
| TW | 201946218 A | 12/2019 | |
| TW | 202013525 A | 4/2020 | |
| WO | 2020021913 A1 | 1/2020 | |
| WO | WO-2020021913 A1 * | 1/2020 | ..... H01L 21/823807 |

* cited by examiner

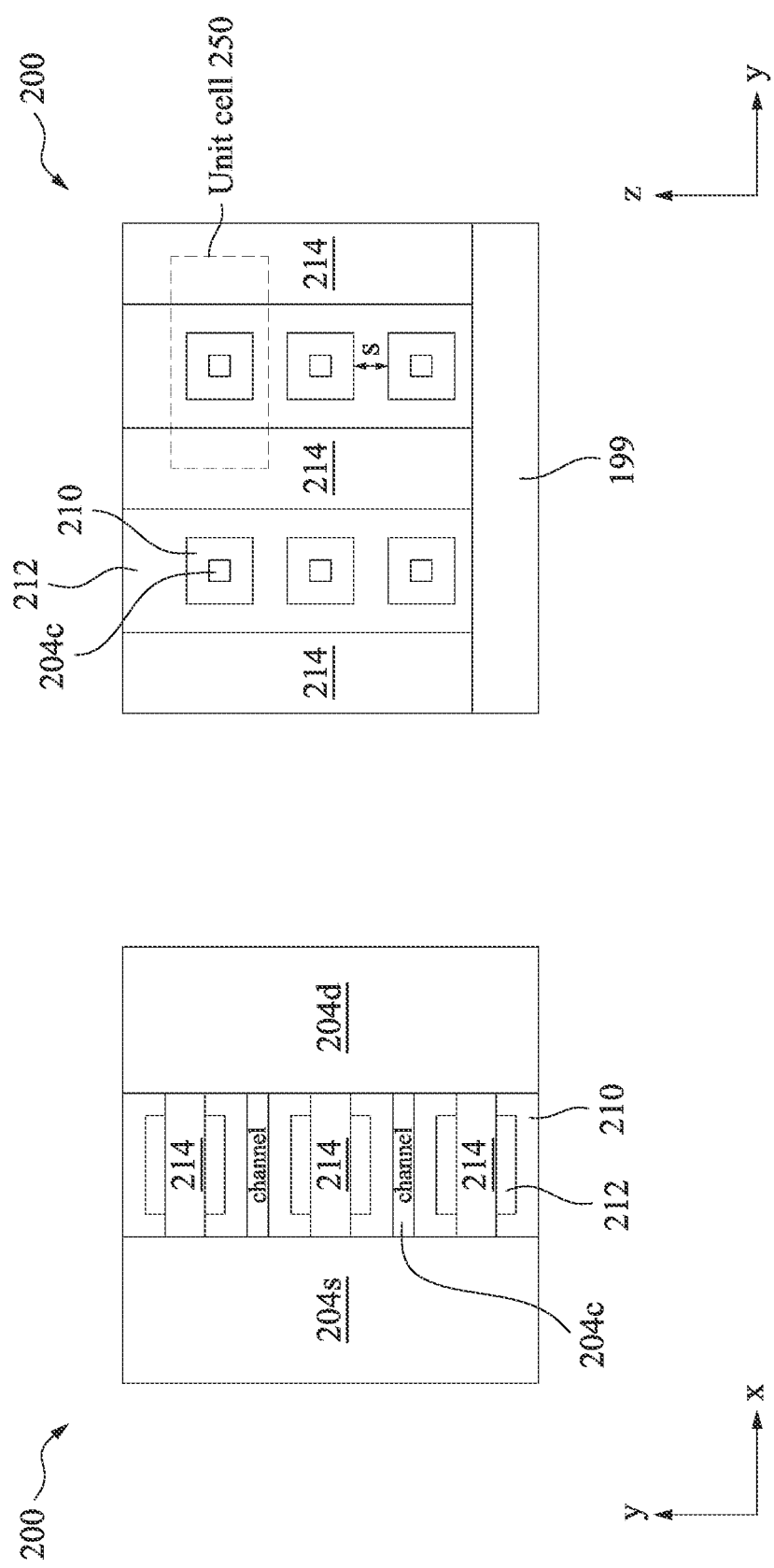

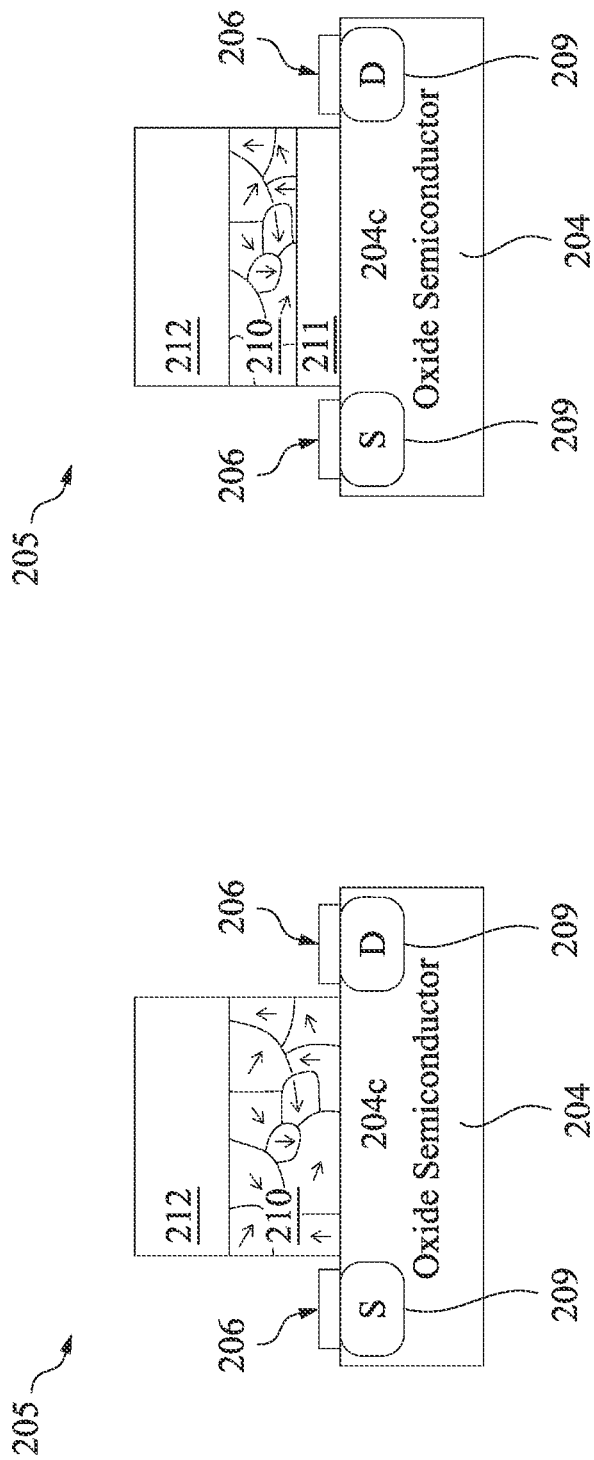

HIGH DENSITY 3D FERAM

PRIORITY

This is a divisional of U.S. patent application Ser. No. 17/106,516, filed Nov. 30, 2020, which claims the benefits of and priority to U.S. Provisional Application Ser. No. 63/045,631, titled "HIGH DENSITY 3D FERAM" and filed Jun. 29, 2020, incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvements. One area of improvements is how to increase ferroelectric memory (FeRAM, FRAM, F-RAM, or FERAM) cell density for various applications, including embedded memory and standalone memory. FERAM is one of candidates for next generation non-volatile memory (NVM) due to its fast write/read speed and small size. Thus, increasing the density of FERAM is highly desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1B and FIG. 1C illustrate a top view and a cross-sectional view of the stacked FERAM structure in FIG. 1A respectively.

FIGS. 4A, 4B, 4C, 4D-1, 4D-2, 4D-3, 4E-1, 4E-2, 4E-3, 4F-1, 4F-2, 4F-3, 4G, 4H, 4I, 4J, 4K, and 4L illustrate various perspective and cross-sectional views of a portion of a stacked FERAM structure, during various fabrication stages of the method in FIG. 3, according to some embodiments of the present disclosure.

FIGS. 6A, 6B, 6C, 6D, 6E, and 6F show various embodiments of a single-bit (1T) FERAM that may be stacked in a stacked FERAM structure according to the present disclosure.

DETAILED DESCRIPTION

Figure 1A:
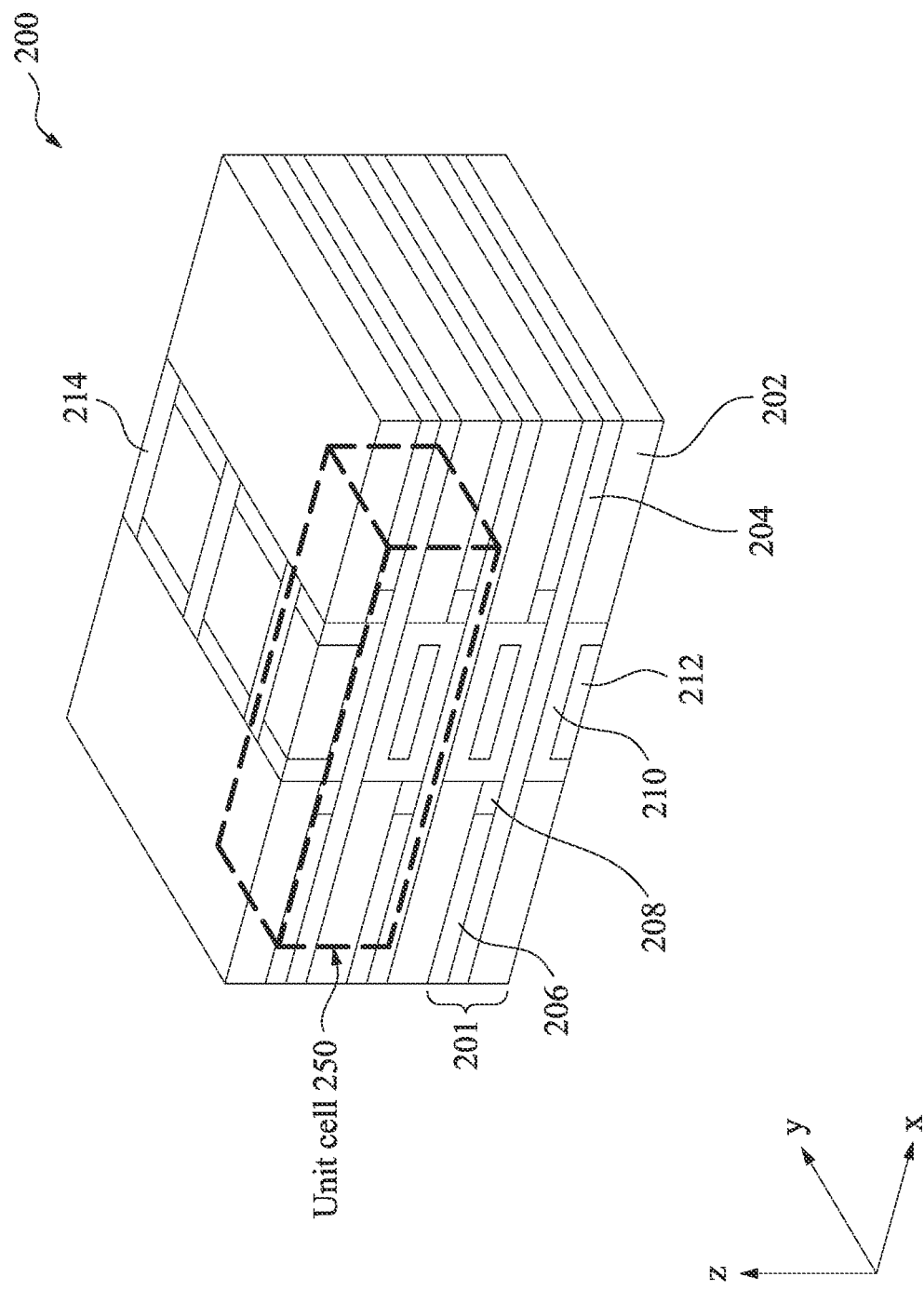
FIG. 1A illustrates a perspective view of a stacked FERAM structure, in portion, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure relates generally to semiconductor fabrication processes and the structures thereof, and more particularly to processes of forming three-dimensional (3D) Ferroelectric RAM (FeRAM, FERAM, F-RAM, or FRAM) memory array for achieving high density memory. The disclosed 3D FERAM can be a standalone memory IC or be integrated with MOSFETs (such as CMOSFETs, FinFETs, gate-all-around (GAA) transistors such as nanowire FETs and nanosheet FETs, or other types of multi-gate FETs) in an IC for increasing the IC's functionality. The disclosed 3D FERAM achieves high density memory. According to the present disclosure, a 3D FERAM array includes multiple layers stacked one over another and each layer includes a 2-dimensional (2D) array of 1-T (single channel or single transistor) FERAM cells. The 2D arrays at different layers are vertically aligned and stacked to form the 3D FERAM array. In each layer, the 1-T FERAM cells are arranged into rows and columns. The FERAM cells in the same column share source and drain electrodes which are connected to supply line (SL) and bit line (BL) of the FERAM array. The FERAM cells in the same row share a common word line (WL) of the FERAM array. The FERAM cells that are vertically aligned share a common gate electrode, which can be connected to the WL. Access to the FERAM cells can be enabled by setting proper voltages to the SL, BL, and WL. Dielectric inner spacers are provided between the gate electrode (such as a metal gate) and the source/drain electrodes to reduce the coupling capacitance therebetween. The present disclosure provides the following benefits. First, by using the disclosed 3D FERAM structure, high-density FERAM memory array can be achieved. Second, in some embodiments, the source/drain electrodes are formed as part of an initial multi-layer stack before the gate electrode is formed and naturally connect all channel layers in the same row. Thus, extra process steps to form the source/drain electrodes is not required (but can certainly be implemented if desired), simplifying the fabrication process. Third, the dielectric inner spacers reduce the coupling capacitance between the gate electrodes and the source/drain electrodes, thereby increasing the operating speed of the FERAM. These and other aspects of the present disclosure are further described by referring to the accompanied figures.

FIG. 1A illustrates a portion of a 3D FERAM structure 200 constructed according to an embodiment of the present disclosure. The 3D FERAM structure 200 is also referred to as the structure 200 or the FERAM array 200 in the present disclosure. In the embodiment shown in FIG. 1A, the structure 200 includes three FERAM layers 201 that are vertically (along the "z" direction) stacked one over another and each FERAM layer 201 includes three FERAM cells (or unit cells) 250 arranged in a column (along the "y" direction). Thus, the embodiment shown in FIG. 1A includes 9 unit cells 250. In various embodiments, the structure 200 may include two or more (such as 2, 3, 4, 5, and so on) FERAM layers 201, and each FERAM layer 201 may include any number of unit cells 250 in a column and may include any number of columns to form a 2D array in the respective FERAM layer 201. Further, the 3D FERAM structure 200 may be a standalone memory device, an embedded memory that is integrated with other circuits in an IC, or part of a stacked 3D IC structure in various embodiments. In the present disclosure, for convenience of discussion, a column of the unit cells 250 are arranged along the "y" direction in FIG. 1A, and a row of the unit cells 250 are arranged along the "x" direction in FIG. 1A.

Figure 1D:
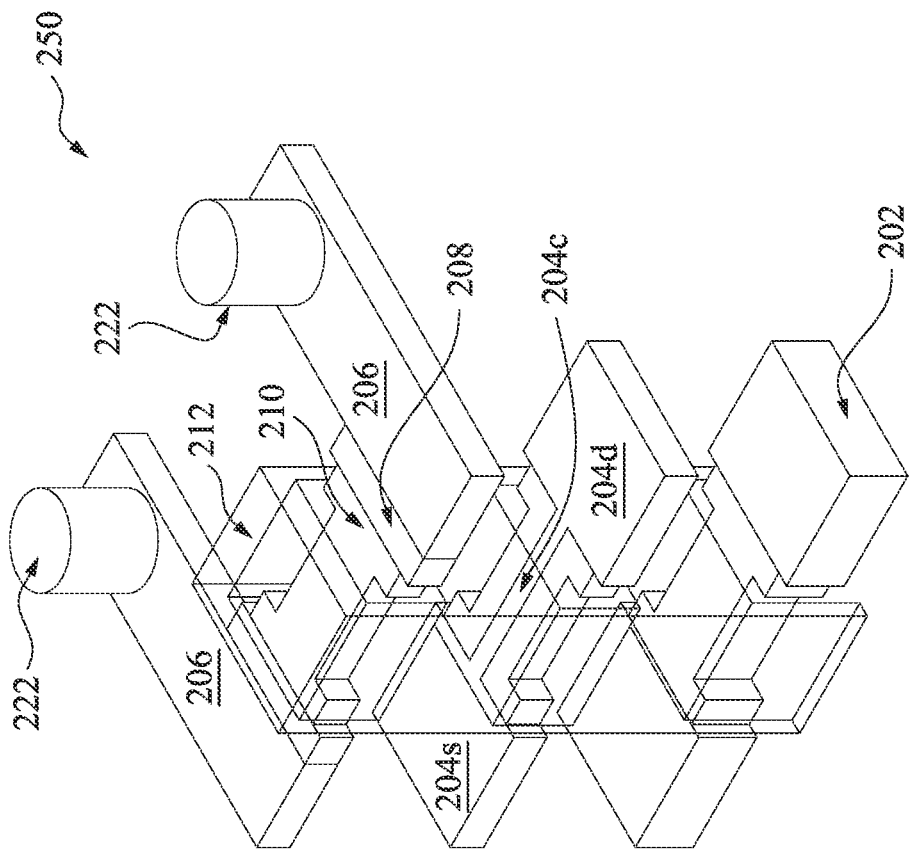
FIG. 1D illustrates a perspective view of certain components of the stacked FERAM structure in FIG. 1A, in accordance with an embodiment.

FIG. 1B illustrates a top view of a portion of the FERAM layer 201 according to an embodiment, FIG. 1C illustrates a cross-sectional view of a portion of the structure 200 according to an embodiment, and FIG. 1D illustrates a perspective view of certain components of the unit cell 250, in a disassembled state, according to an embodiment.

Referring to FIG. 1D, a unit cell 250 includes an isolation structure 202, a semiconductor layer 204 (such as providing a source region 204s, a drain region 204d, and a channel region 204c for the unit cell 250), an FE layer 210 wrapping around the channel region 204c, a metal layer 206 (such as providing a source electrode and a drain electrode and supporting a source via 220 and a drain via 222 thereon respectively), a spacer feature (or inner spacer) 208, and a gate electrode 212 that wraps around the FE layer 210. The semiconductor layer 204 is disposed over the isolation structure 202. The metal layer 206 is disposed over the semiconductor layer 204. The inner spacer 208 is disposed over the semiconductor layer 204 and laterally (along the "x" direction) between the FE layer 210 and the metal layer 206.

Referring to FIGS. 1A, 1B, and 1C, the structure 200 includes a gate spacer (or gate isolation) 214 that extends vertically from an isolation structure 199 (such as an inter-level dielectric layer) and is disposed laterally (along the "y" direction) between the gate electrodes 212 of adjacent rows for isolating the gate electrodes 212 one from another.

In an embodiment, the isolation structure 202 includes a dielectric material such as silicon nitride ($Si_3N_4$), or silicon oxide ($SiO_2$), other suitable dielectric material, or a combination thereof. The isolation structure 202 may have a thickness (along the "z" direction) in a range of about 10 nm to about 100 nm in some embodiments. In an embodiment, the semiconductor layer 204 includes an oxide semiconductor such as indium gallium zinc oxide (IGZO), indium tungsten oxide (IWO), indium tin oxide (ITO), zinc oxide (ZnO), other suitable oxide semiconductor, or a combination thereof. In another embodiment, the semiconductor layer 204 includes polysilicon. In yet another embodiment, the semiconductor layer 204 includes silicon or other suitable semiconductor material. The semiconductor layer 204 may have a thickness (along the "z" direction) in a range of about 10 nm to about 60 nm in some embodiments. In an embodiment, the metal layer 206 includes a conductive material such as titanium nitride, tantalum nitride, ruthenium, tungsten, other suitable conductive materials, or a combination thereof. The metal layer 206 may have a thickness (along the "z" direction) in a range of about 10 nm to about 60 nm in some embodiments.

In an embodiment, the FE layer 210 includes hafnium oxide ($HfO_2$); hafnium zirconium oxide ($Hf_xZr_{1-x}O_2$); $HfO_2$ doped with Si, Y, Ge, La, or other suitable elements; aluminum scandium nitride ($Al_{1-x}Sc_xN$); aluminum nitride (AlN); or other suitable ferroelectric materials. The FE layer 210 may have a thickness in a range of about 5 nm to about 30 nm in some embodiments. In an embodiment, the inner spacer 208 includes a low-k dielectric material, for example, a dielectric material with a dielectric constant (k value) less than 10, such as in a range of about 3 to about 10. For example, the inner spacer 208 may include SiCN, SiC, SiON, SiOCN, $Al_2O_3$, or other suitable dielectric materials. Because the FE layer 210 is generally a high-k dielectric material, having the inner spacers 208 formed of a low-k (or lower-k) dielectric material reduces the coupling capacitance between the gate electrode 212 and the metal layer 206, thereby increasing the operating speed of the FERAM structure 200. The inner spacers 208 may have a length (dimension along the "x" direction) in a range about 5 nm to about 30 nm in some embodiments. If the inner spacer 208 is too thin (such as less than about 5 nm), it might not effectively reduce the coupling capacitance between the gate electrode 212 and the metal layer 206, and the risk of shorting the gate electrode 212 and the metal layer 206 might be too great. If the inner spacer 208 is too thick (such as more than about 30 nm), then it would unnecessarily increase the footprint of the unit cell 250 and would reduce the memory density of the 3D FERAM structure 200.

In an embodiment, the gate electrode 212 includes a p-type work function layer so that the FERAM unit cell 250 has a positive threshold voltage. For example, the gate electrode 212 may comprise a metal with a sufficiently large effective work function, such as titanium nitride, tantalum nitride, ruthenium, molybdenum, tungsten, platinum, or combinations thereof. The gate electrode 212 may further include a low-resistance metal such as aluminum, tungsten, cobalt, copper, and/or other suitable materials. In some embodiments, the gate electrode 212 includes an n-type work function layer such as titanium, aluminum, tantalum carbide, tantalum carbide nitride, tantalum silicon nitride, or combinations thereof. In some embodiments, the vias 220 and 222 may each include one or more conductive materials such as Co, W, Ru, Al, Mo, Ti, TiN, TiSi, CoSi, NiSi, TaN, Ni, TiSiN, or combinations thereof. In some embodiments, the gate isolation 214 includes a dielectric material such as silicon oxide ($SiO_2$), silicon nitride ($Si_3N_4$), silicon oxynitride (SiON), silicon oxycarbonitride (SiOCN), fluoride-doped silicate glass (FSG), a low-k dielectric material, and/or other suitable insulating material.

Figure 2:
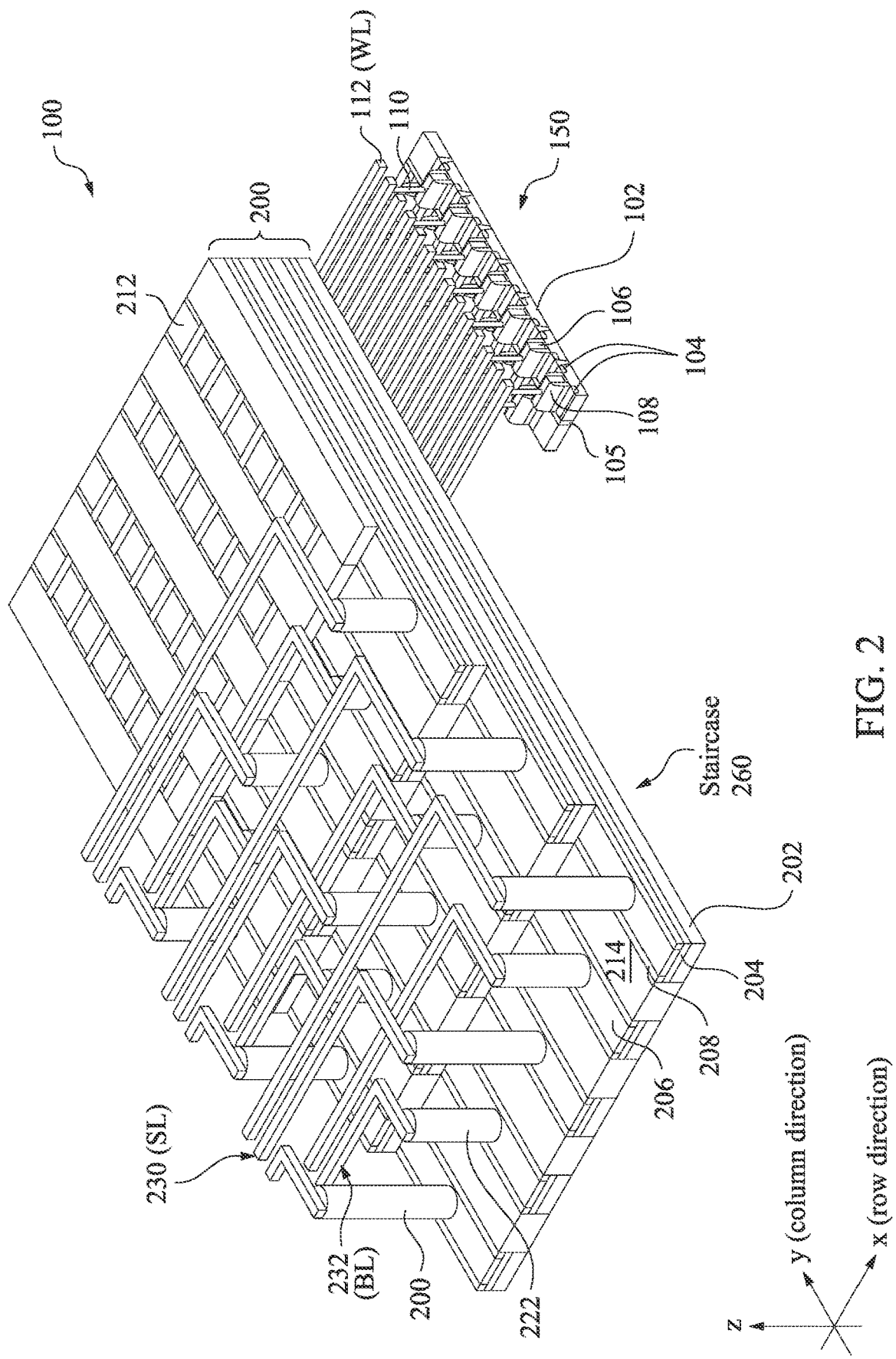
FIG. 2 illustrates a perspective view of a portion of a semiconductor device having a stacked FERAM structure integrated therein, such as the one shown in FIG. 1A, according to various aspects of the present disclosure.

FIG. 2 illustrates a perspective view of a portion of a semiconductor device 100 (such as an integrated circuit) having a 3D FERAM structure 200 integrated therein, according to various aspects of the present disclosure. The FERAM layers 201 are patterned into a staircase structure 260. The vias 220 and 222 are disposed on the metal layer 206 on each step of the staircase structure 260. In addition to the features of the 3D FERAM structure 200 discussed above, the semiconductor device 100 includes source lines (SL) 230 and bit lines (BL) 232 that are connected to the vias 220 and 222 respectively and word lines (WL) 112 that are connected to the gate electrodes 212. In the embodiment depicted in FIG. 2, the WL 112 are further connected to gate vias 110 disposed over gate electrodes 106 of various transistors 150. The transistors 150 are implemented in or on a substrate 102 and include source/drain regions 104, gate electrodes 106, and gate spacers 108. The transistors 150 are isolated one from another by an isolation structure (such as shallow trench isolation STI) 105. The transistors 150 may be planar MOS transistors, FinFET, gate-all-around (GAA) transistors, or other types of transistors. In the embodiment shown in FIG. 2, the WL 112 are connected to the gate electrodes 212 from under the bottommost FERAM layer 201. In another embodiment, the WL 112 are connected to the gate electrodes 212 from above the topmost FERAM layer 201. In the embodiment shown in FIG. 2, the 3D FERAM structure 200 may be implemented at the $N^{th}$ interconnect layer (or metal layer) of the semiconductor device 100 above the transistors 150, where N is a natural number. For example, the 3D FERAM structure 200 may be implemented at the $4^{th}$ interconnect layer of the semiconductor device 100 (in other words, the 3D FERAM structure 200 may be implemented between the $3^{rd}$ and the $5^{th}$ interconnect layers of the semiconductor device 100). The device 100 shown in FIG. 2 is an example where the 3D FERAM structure 200 is implemented at the BEOL of the device 100 and above the transistors 150 that are implemented at the FEOL of the device 100.

Figure 3:
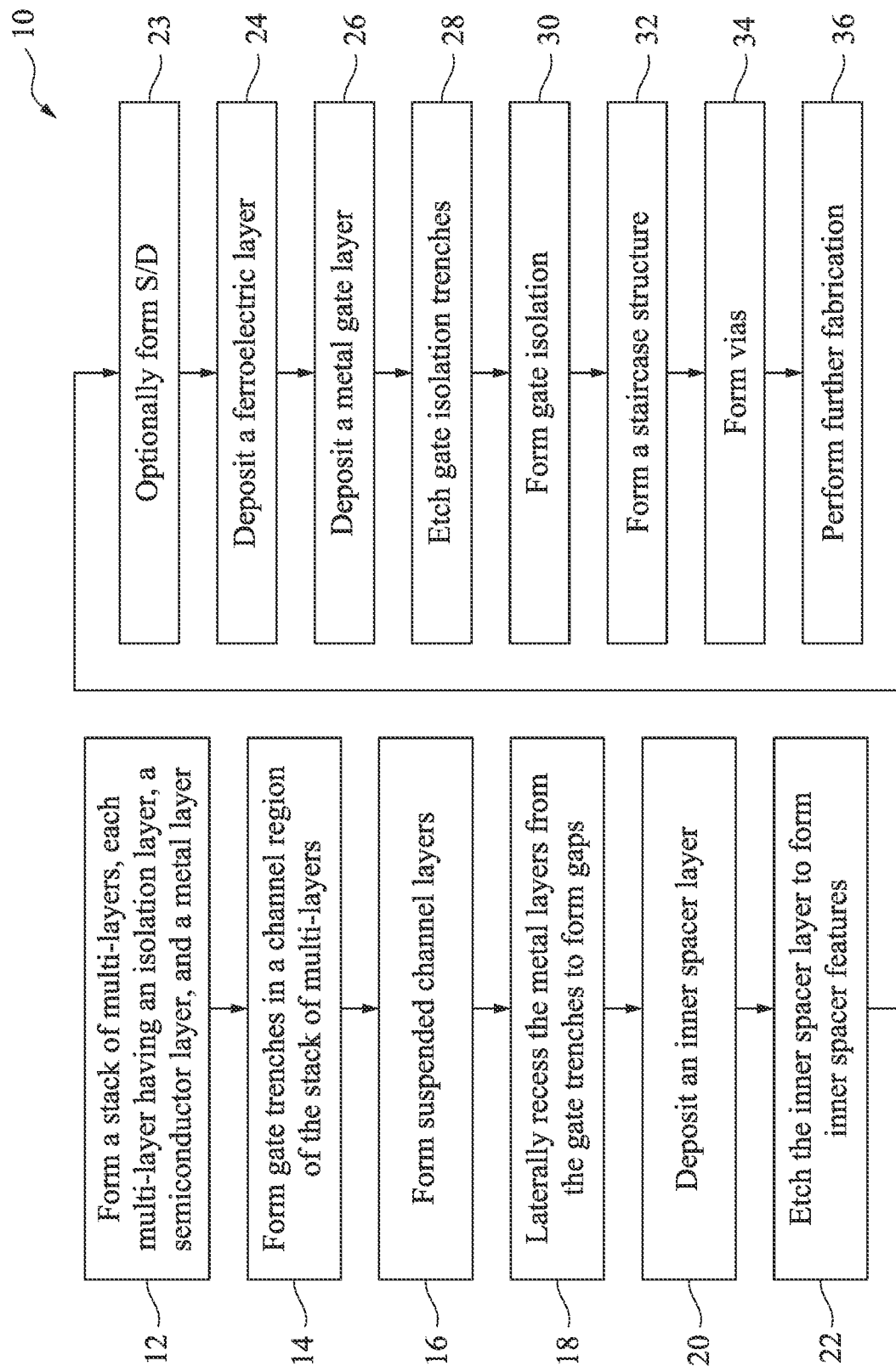
FIG. 3 show a flow chart of a method of forming a stacked FERAM structure, according to various aspects of the present disclosure.

FIG. 3 is a flow chart of a method 10 for fabricating a semiconductor device according to various aspects of the present disclosure. Additional processing is contemplated by the present disclosure. Additional operations can be provided before, during, and after method 10, and some of the operations described can be moved, replaced, or eliminated for additional embodiments of method 10. Method 10 is described below in conjunction with FIGS. 4A-4L that illustrate various perspective and cross-sectional views of a 3D FERAM structure 200 at various steps of fabrication according to the method 10, in accordance with some embodiments. In some embodiments, the 3D FERAM structure 200 is a standalone memory device. In some embodiments, the 3D FERAM structure 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. For example, the 3D FERAM structure 200 may be implemented at the back-end-of-line (BEOL) of an IC and above CMOS transistors that are implemented at the front-end-of-line (FEOL) of the IC. FIGS. 4A-4L have been simplified for the sake of clarity to better understand the inventive concepts of the present disclosure. Additional features can be added in the structure 200, and some of the features described below can be replaced, modified, or eliminated in other embodiments of the structure 200.

At operation 12, the method 10 (FIG. 1A) provides a stack of multi-layers 201 as an intermediate structure of the 3D FERAM structure 200. Referring to FIG. 4A, in the present embodiment, each multi-layer 201 includes an isolation layer 202, a semiconductor layer 204 over the isolation layer 202, and a metal layer 206 over the semiconductor layer 204. The 3D FERAM structure 200 further includes another isolation layer 202 on top of the stack of multi-layers 201 in the present embodiment. In other words, both the bottom-most layer and topmost layer are isolation layers 202. The embodiment shown in FIG. 4A has three multi-layers 201 in the stack. In various embodiments, the structure 200 may include two or more multi-layers 201 in the stack. The materials and the thicknesses for the layers 202, 204, and 206 have been discussed above with reference to FIGS. 1A through 1D. Each of the layers 202, 204, and 206 may be formed by CVD, PVD, ALD, or other suitable methods.

Figure 4B:
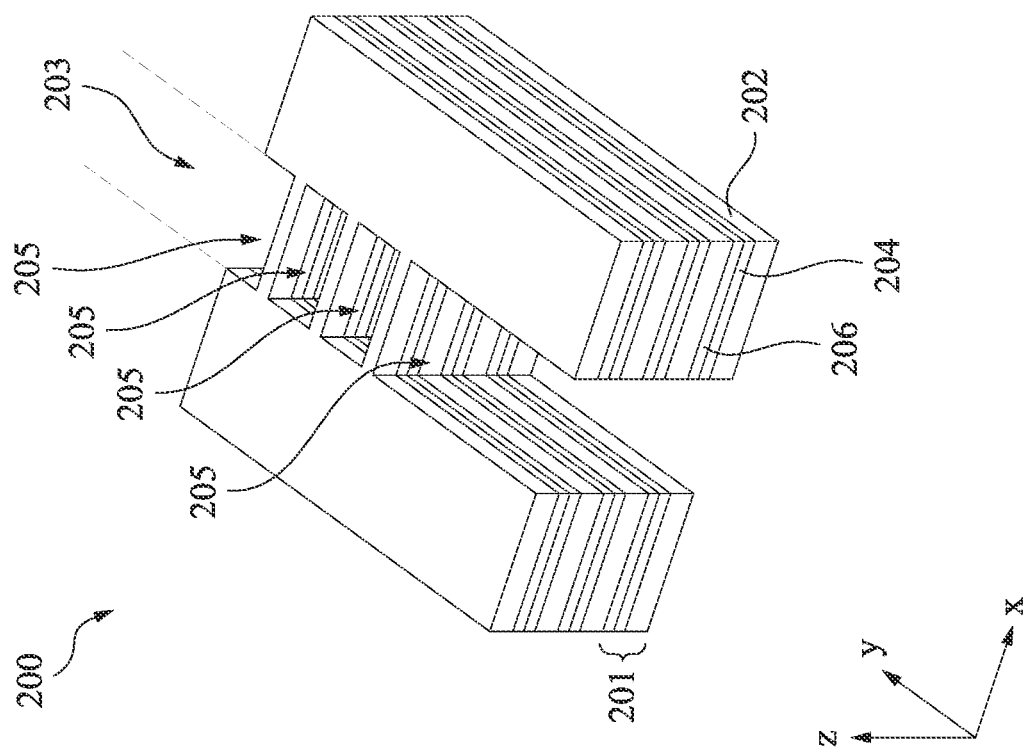
Figure 4A:
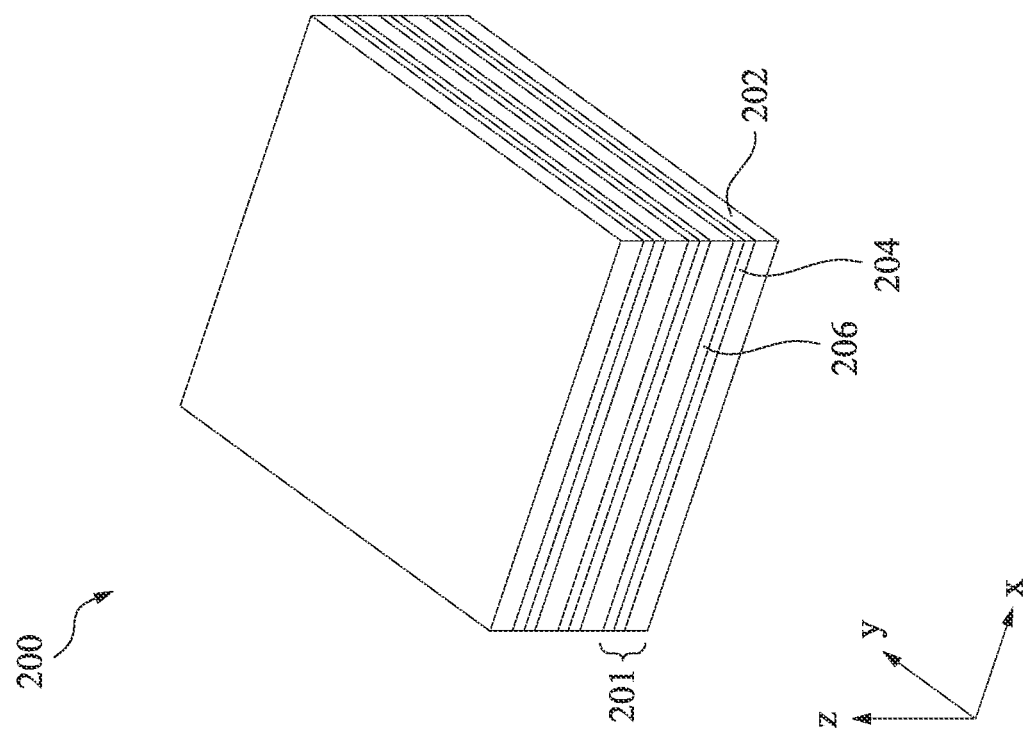

At operation 14, the method 10 (FIG. 1A) forms gate trenches 205 in a channel region 203 of the stack of multi-layers 201, such as shown in FIG. 4B. In an embodiment, operation 14 includes performing a photolithography process to form an etch mask over the structure 200. The photolithography process may include forming a resist layer over the structure 200 (e.g., by spin coating), performing a pre-exposure baking process, performing an exposure process using a photomask, performing a post-exposure baking process, and developing the exposed resist layer in a developer solution. After development, the patterned resist layer includes a resist pattern that corresponds to the photomask, where the resist pattern provides openings corresponding to the gate trenches 205 while covering the rest of the structure 200. Alternatively, the exposure process can be implemented or replaced by other methods, such as maskless lithography, e-beam writing, ion-beam writing, or combinations thereof.

After the etch mask is formed, operation 14 etches the stack of multi-layers 201 through the openings in the etch mask to form the gate trenches 205. Operation 14 may apply one or more etching processes that are selectively targeted at the materials of the layers 206, 204, and 202. Operation 14 may apply a cyclic multi-etching process in an embodiment. For example, operation 14 may apply a first etching process that is targeted at the materials of the layers 202, apply a second etching process that is targeted at the materials of the layers 206, and apply a third etching process that is targeted at the materials of the layers 204. Operation 14 may repeatedly apply the first, the second, and the third etching processes in a cyclic order until all the layers in the structure 200 are etched through. In the present embodiment, the various etching processes may include dry etching, reactive ion etching (RIE), and/or other suitable processes. For example, a dry etching process may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), ammonia, argon, other suitable gases and/or plasmas, and/or combinations thereof. After the gate trenches 205 are etched, operation 14 removes the etch mask, for example, using resist stripping or other methods.

Figure 4C:
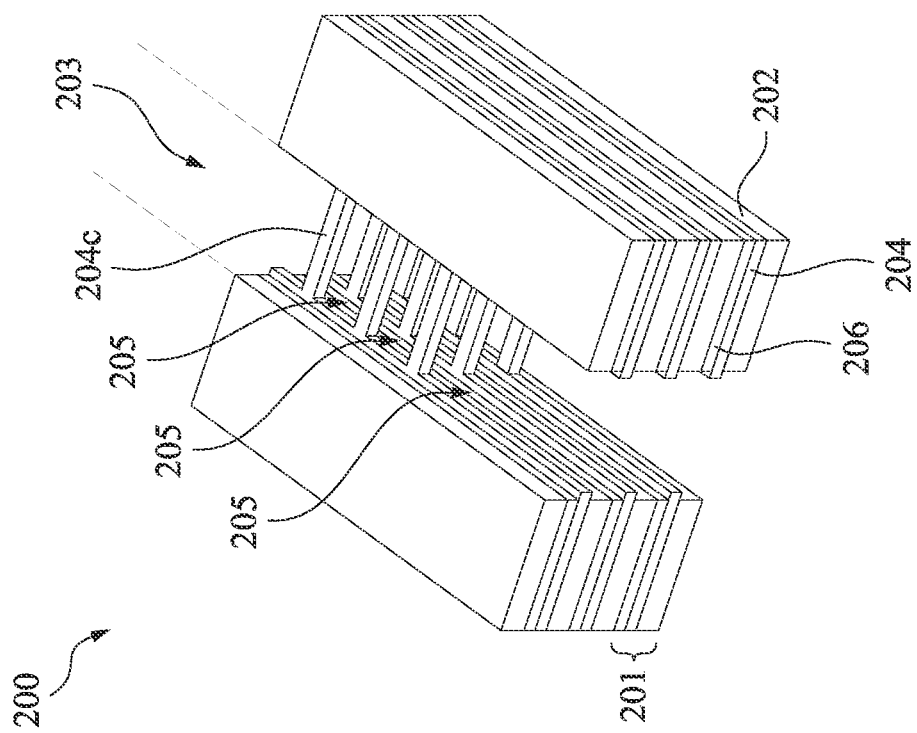
Figures 2, 4D:
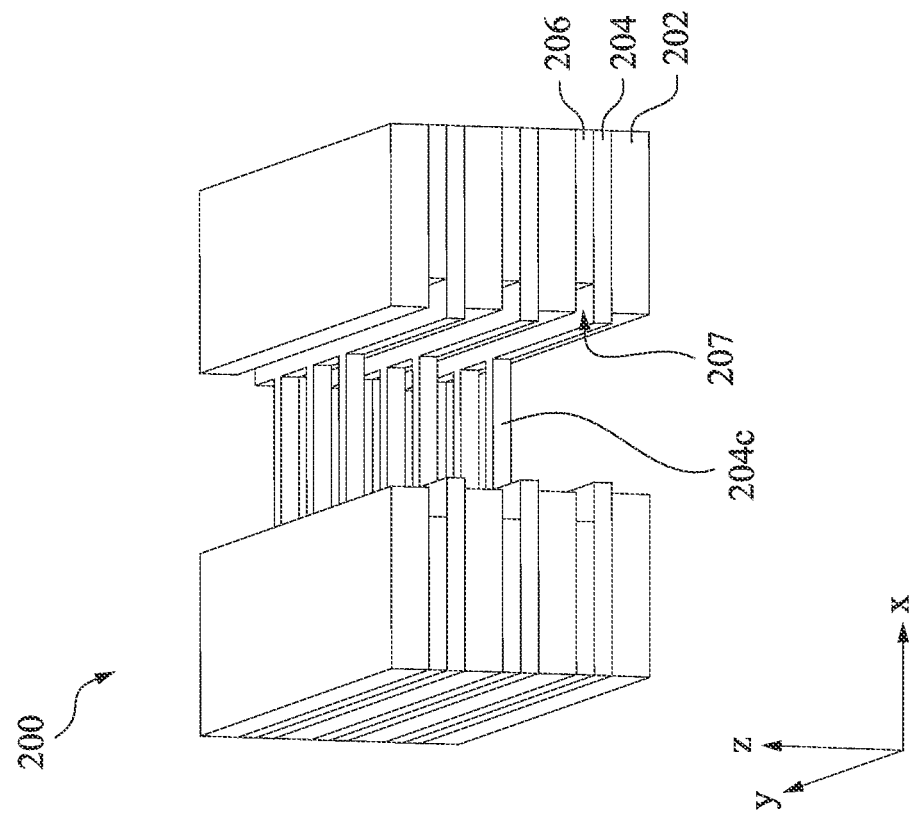
Figures 1, 4D:
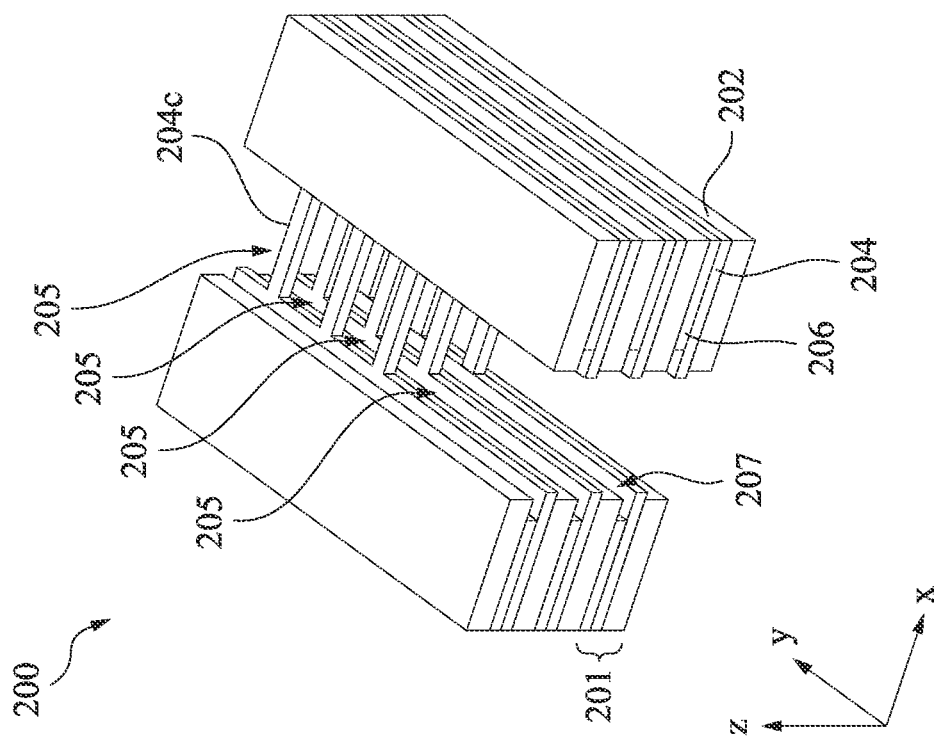
Figures 3, 4D:
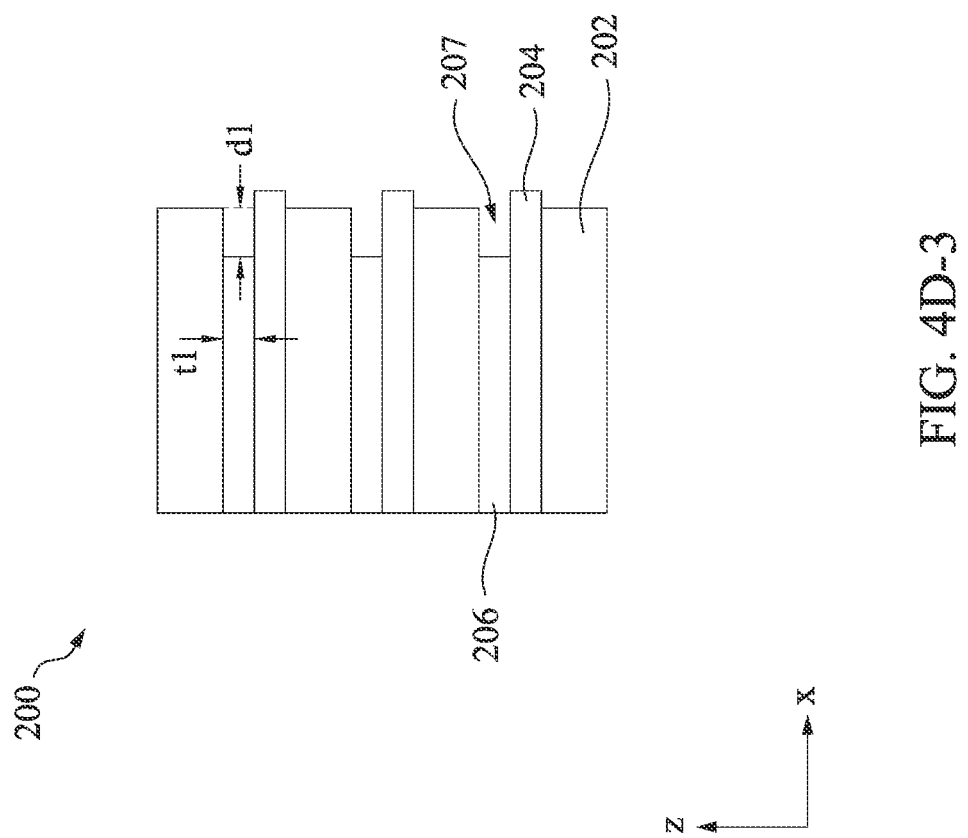
Figures 2, 4E:
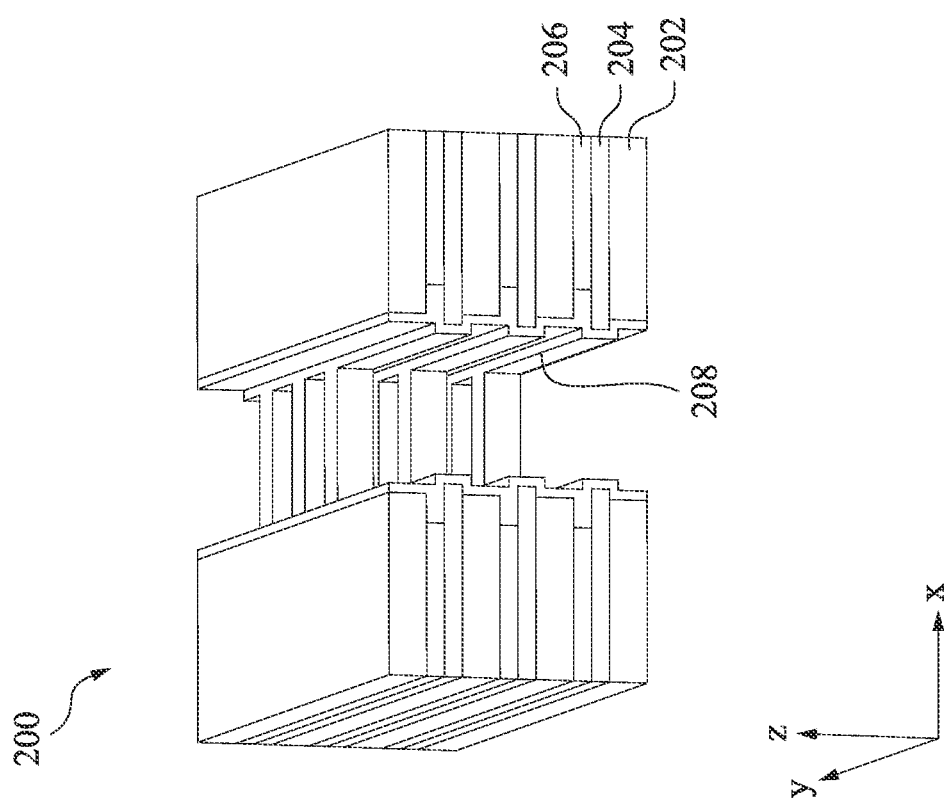
Figures 1, 4E:
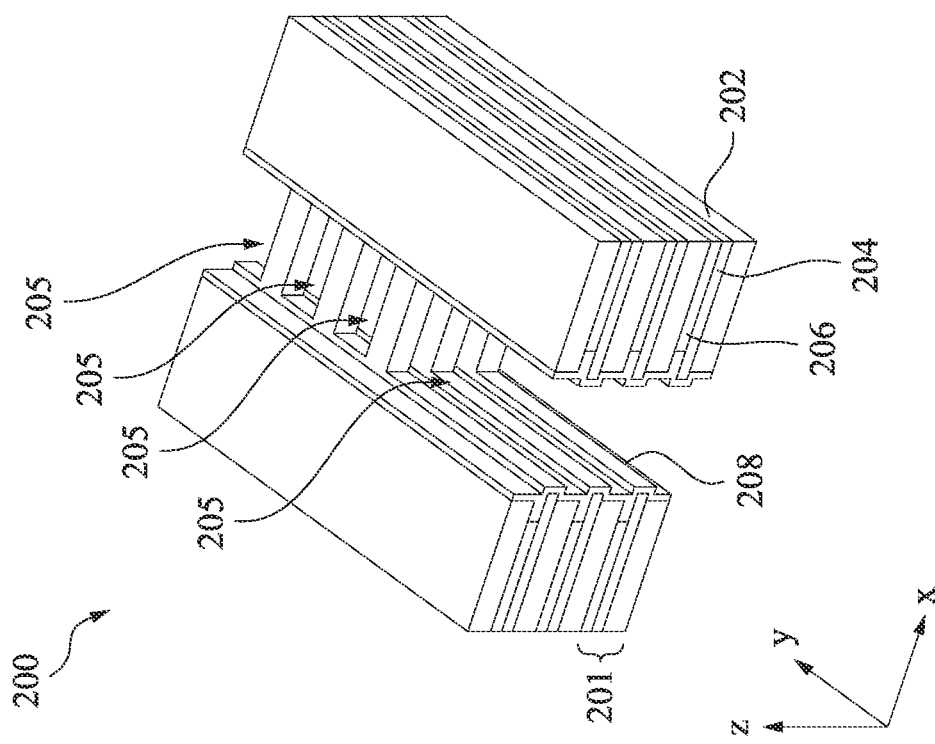
Figures 3, 4E:
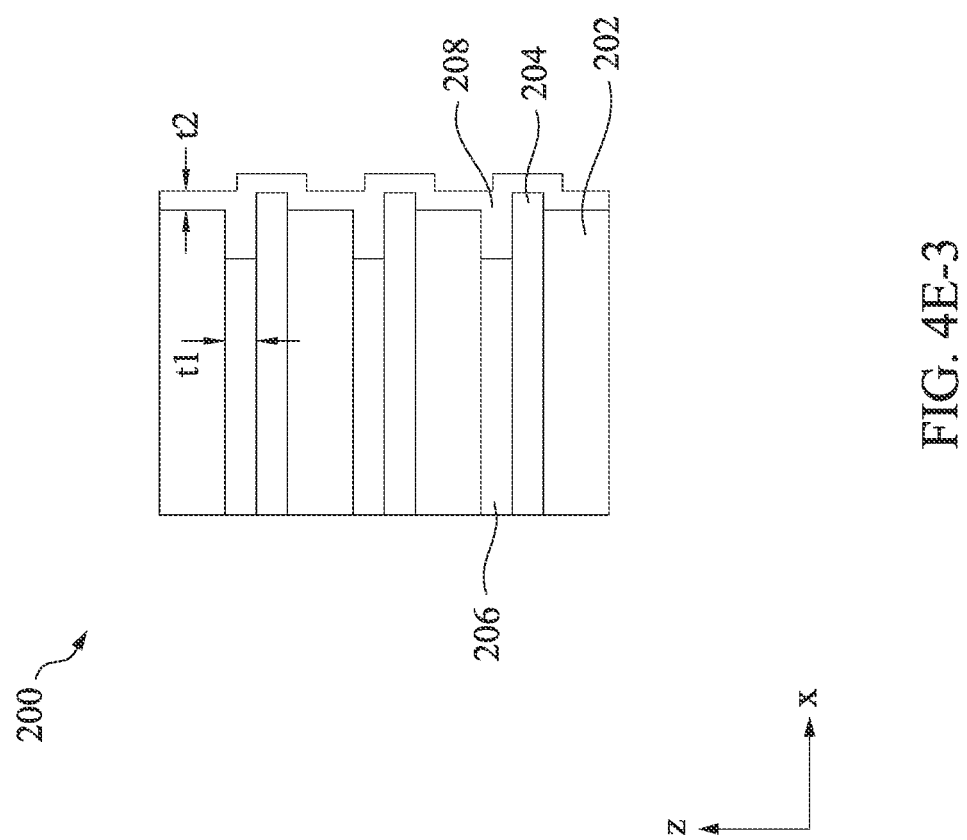

At operation 16, the method 10 (FIG. 1A) forms suspended channel layers 204c in the gate trenches 205, such as shown in FIG. 4C. In an embodiment, operation 16 includes performing a photolithography process to form an etch mask over the structure 200. The etch mask exposes the channel region 203 of the structure 200 while covering the rest of the structure 200. After the etch mask is formed, operation 16 applies one or more etching processes that selectively etch the isolation layer 202 and the metal layer 206 with minimal (to no) etching of the semiconductor layers 204, thereby forming the suspended channel layers 204c. In an embodiment, the various etching processes may include dry etching, wet etching, reactive ion etching (RIE), and/or other suitable processes. For example, a dry etching process may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), other suitable gases and/or plasmas, and/or combinations thereof. For example, a wet etching process may comprise etching in hydrofluoric acid (HF); diluted hydrofluoric acid (DHF); sulfuric acid ($H_2SO_4$); hydrogen chloride (HCl), phosphoric acid ($H_3PO_4$); or other suitable wet etchant. As a result of the etching, the semiconductor layers 204 may extend slightly past the isolation layers 202 and the metal layer 206 towards the gate trenches 205 along the "x" direction (this is also illustrated in FIGS. 4D-2 and 4D-3).

At operation 18, the method 10 (FIG. 1A) laterally recesses the metal layer 206 from the gate trenches 205 to form gaps 207 vertically between adjacent layers 204 and 202, such as shown in FIGS. 4D-1, 4D-2, and 4D-3. The etch mask formed in the operation 16 may be kept and re-used during the operation 18 in an embodiment. Alternatively, the etch mask formed in the operation 16 is removed before the operation 18 is performed. Operation 18 applies one or more etching processes that selectively etch the metal layer 206 with minimal (to no) etching of the isolation layer 202 and the semiconductor layers 204, thereby forming the gaps 207. In an embodiment, the various etching processes may include dry etching, wet etching, reactive ion etching (RIE), and/or other suitable processes. In various embodiments, the depth dl of the gaps 207 (FIG. 4D-3) is controlled to be in a range of about 5 nm to about 30 nm as measured along the "x" direction from an edge of the isolation layer 202 that faces the gate trenches 205. Also, the semiconductor layers 204 extend past the isolation layers 202 and the metal layer 206 towards the gate trenches 205 along the "x" direction. The thickness t1 of the metal layer 206 (also the height of the gaps 207 along the "z" direction) is in a range of about 10 nm to about 60 nm in some embodiments.

At operation 20, the method 10 (FIG. 1A) deposits an inner spacer layer on the surfaces of the layers 202, 204 (including 204c), and 206 that are exposed by the gate trenches 205 and the gaps 207, such as shown in FIGS. 4E-1, 4E-2, and 4E-3. Particularly, the inner spacer layer 208 fills the gaps 207. In an embodiment, the inner spacer layer 208 includes a low-k dielectric material, for example, a dielectric material with a dielectric constant less than 10, such as in a range of about 3 to about 10. For example, the inner spacer layer 208 may include SiCN, SiC, SiON, SiOCN, $Al_2O_3$, or other suitable dielectric materials. Example low-k dielectric materials suitable for the inner spacer layer 208 include fluoride-doped silica glass, carbon doped silicon oxide, Xerogel, Aerogel, amorphous fluorinated carbon, Parylene, Benzocyclobutene (BCB), polyimide, other low-k dielectric material, or combinations thereof. In the present embodiment, the inner spacer layer 208 is deposited using ALD. In alternative embodiments, the inner spacer layer 208 may be deposited using CVD or other suitable methods. The inner spacer layer 208 has a thickness t2 (FIG. 4E-3) in a range about 5 nm to about 20 nm in the present embodiment. Particularly, the thickness t2 is greater than half of the thickness t1 so that the inner spacer layer 208 merges within the gaps 207 and fully fills the gaps 207.

Figures 2, 4F:
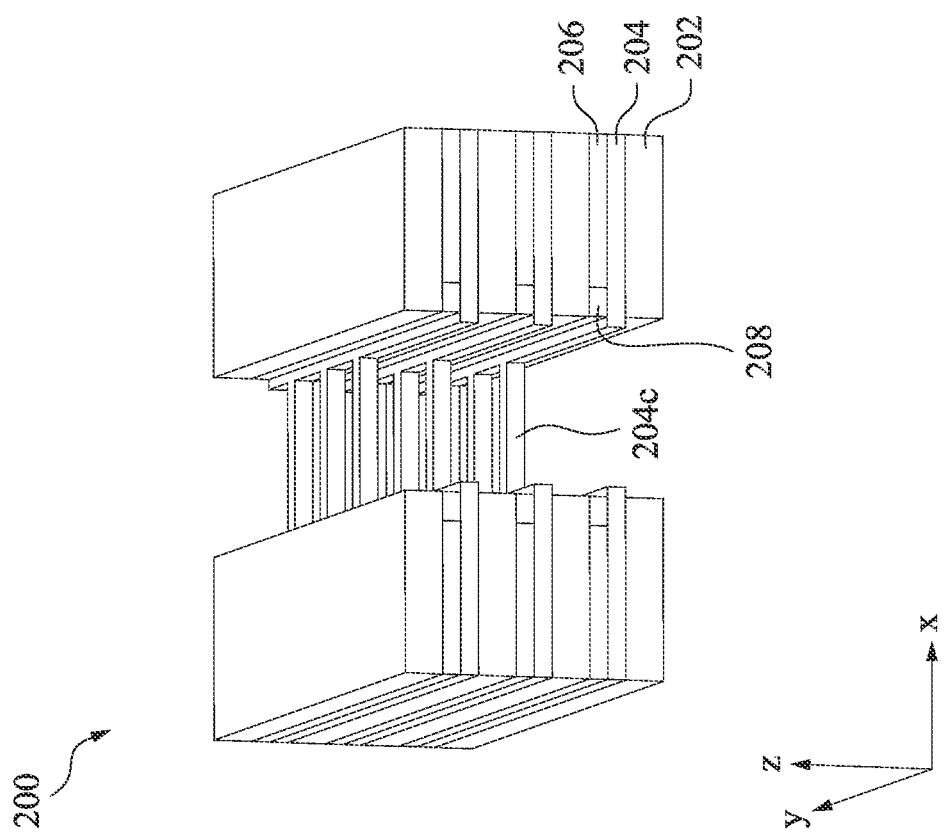
Figures 1, 4F:
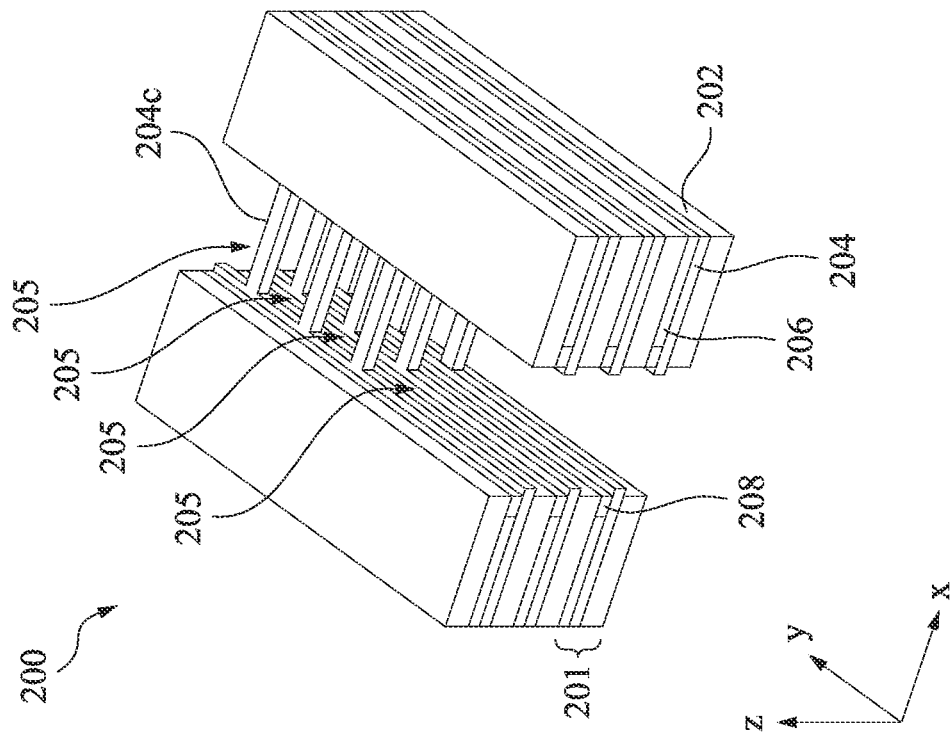
Figures 3, 4F:
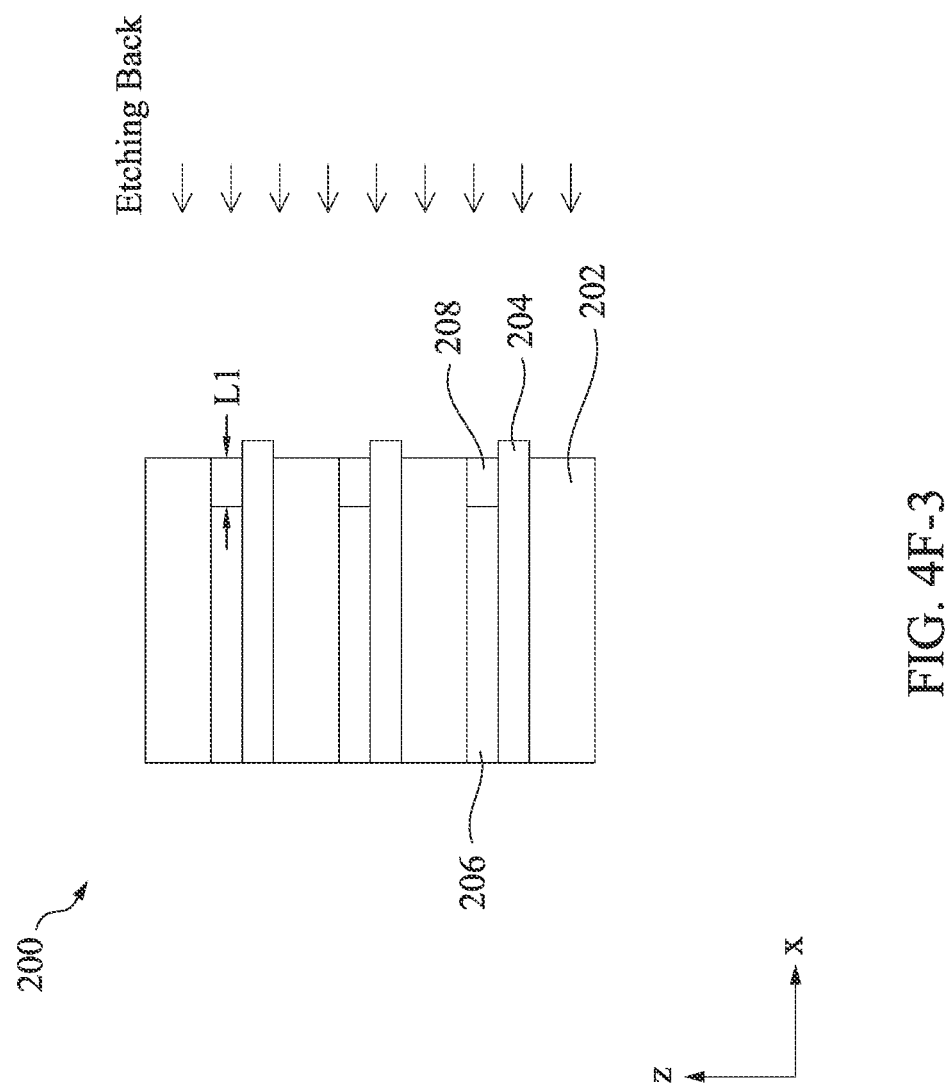

At operation 22, the method 10 (FIG. 1A) etches back the inner spacer layer 208 to remove it from the surfaces of the layers 202 and 204 that face the gate trenches 205, leaving remaining portions of the inner spacer layer 208 in the gaps 207 as the inner spacer features 208, such as shown in FIGS. 4F-1, 4F-2, and 4F-3. In various embodiments, the etch-back process may apply dry etching, wet etching, or reactive ion etching that is tuned selective to the material of the inner spacer layer 208, and with minimal (to no) etching of the semiconductor layers 204 and the isolation layers 202. For example, the etch-back process may apply an isotropic wet etching process. As a result of the operation 22, the channel regions 204c are exposed in the gate trenches 205, and the surfaces of the layers 202 and 204 that face the gate trenches 205 are also exposed. In an embodiment, the inner spacer features 208 completely fill the gaps 207 and the length L1 of the inner spacer features 208 along the "x" direction is substantially equal to the depth dl of the gaps 207, such as shown in FIG. 4F-3. In another embodiment, the inner spacer features 208 partially fill the gaps 207 and the length L1 of the inner spacer features 208 along the "x" direction is less than the depth dl of the gaps 207. For example, the length L1 is about 80% to about 90% of the depth dl. In various embodiments, the length L1 may be in a range of about 5 nm to about 30 nm. If the length L1 is too small (such as less than about 5 nm), the inner spacer features 208 might not effectively reduce the coupling capacitance between the gate electrode 212 and the metal layer 206, and the risk of shorting the gate electrode 212 and the metal layer 206 might be too great. If the length L1 is too great (such as more than about 30 nm), then the inner spacer features 208 would unnecessarily increase the footprint of the unit cell 250 and would reduce the memory density of the 3D FERAM structure 200.

Figures 6A, 6B:
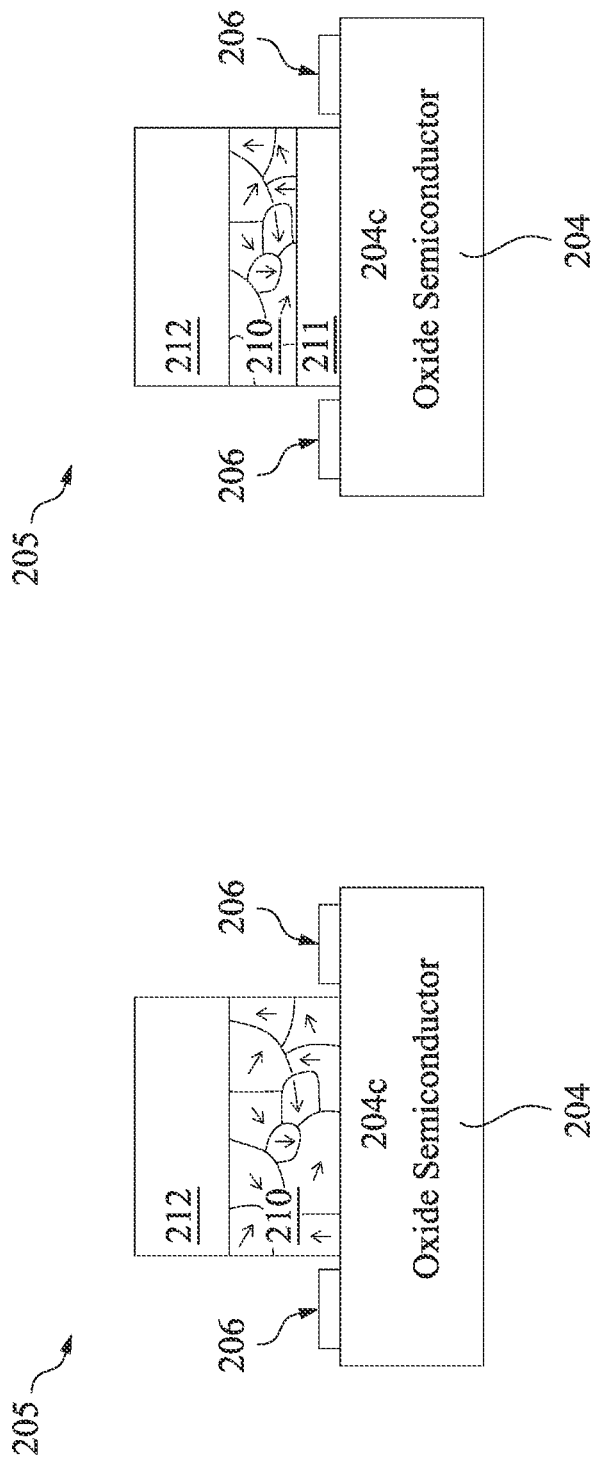
Figures 6E, 6F:
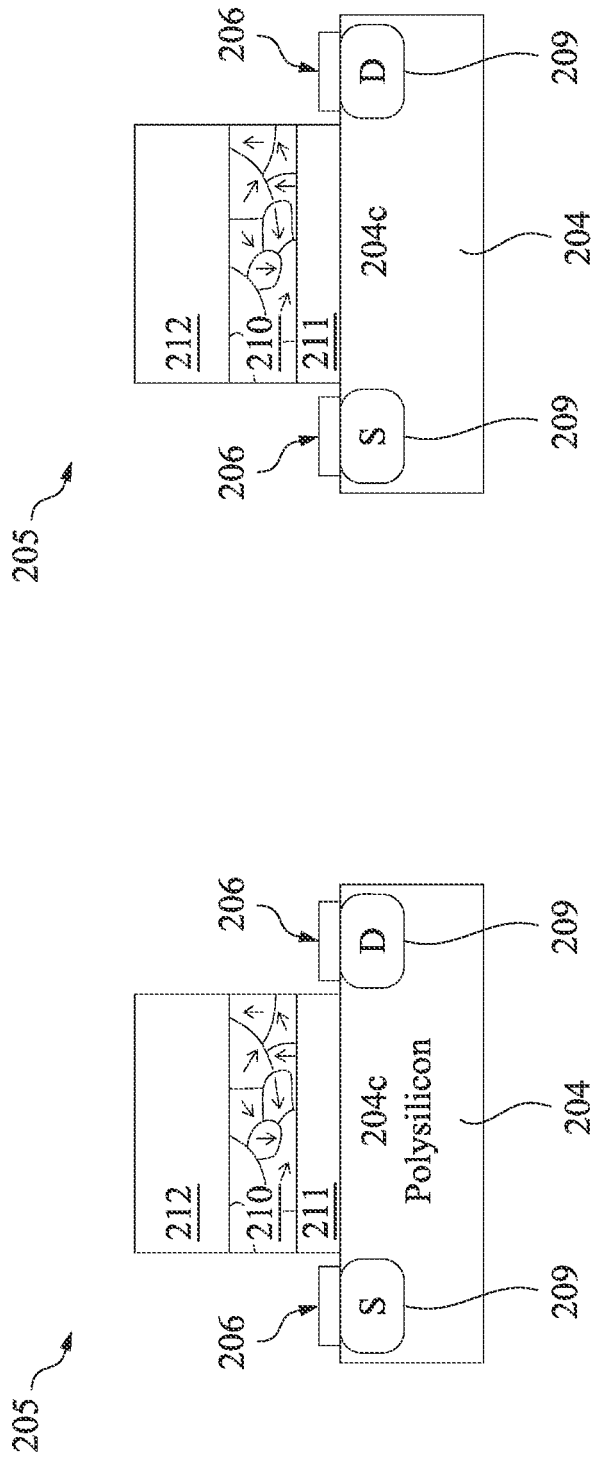

At operation 23, the method 10 (FIG. 1A) optionally forms source/drain (S/D) features 209 in the semiconductor layers 204. As illustrated in FIGS. 6B, 6D, 6E, and 6F, S/D features 209 may be formed in some embodiments of the FERAM unit cells 250. In embodiments where the semiconductor layer 204 includes an oxide semiconductor material (such as shown in FIGS. 6B and 6D), the S/D features 209 may be formed by annealing the device 200 (for example, in an oxygen ambient or a nitrogen ambient) such that the metal layer 206 reacts with the semiconductor layer 204 to form the S/D features 209. In embodiments where the semiconductor layer 204 includes polysilicon or other non-oxide semiconductor materials (such as shown in FIGS. 6E and 6F), the S/D features 209 may be formed by doping appropriate p-type or n-type dopants into the semiconductor layer 204, for example, by ion implantation.

Figure 4G:
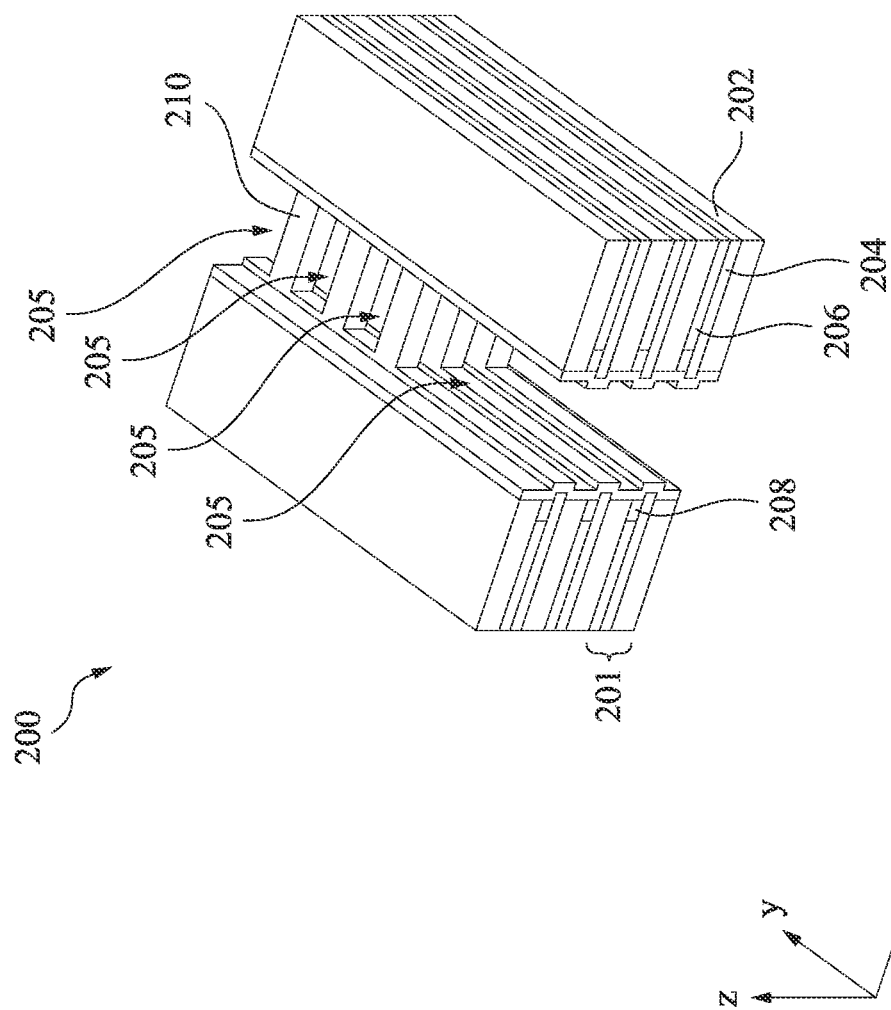

At operation 24, the method 10 (FIG. 1A) deposits a FE layer 210 on the various surfaces (including the surfaces of the isolation structure 202, the semiconductor layer 204, and the inner spacer features 208) that are exposed in the gate trenches 205. An embodiment of which is shown in FIG. 4G. Particularly, the FE layer 210 is deposited to surround each of the channel regions 204c while leaving space S (see FIG. 1C) between the FE layer 210 on vertically adjacent channel regions 204c. The space S is large enough for filling gate electrode 212 therein for a desired deposition technique, such as ALD, CVD, PVD, or plating. In an embodiment, the FE layer 210 is deposited to have a substantially uniform thickness on the various surfaces discussed above. The thickness of the FE layer 210 may be in a range from about 5 nm to about 30 nm in various embodiments. In an embodiment, the FE layer 210 is deposited using ALD to control the preciseness of the deposited thickness. In some embodiments, the FE layer 210 may be deposited using CVD, PVD, or other deposition techniques. In the present embodiment, the FE layer 210 includes hafnium oxide ($HfO_2$); hafnium zirconium oxide ($Hf_xZr_{1-x}O_2$); $HfO_2$ doped with Si, Y, Ge, La, or other suitable elements; aluminum scandium nitride ($Al_{1-x}Sc_xN$); aluminum nitride (AlN); or other suitable ferroelectric materials.

In some embodiments, before depositing the FE layer 210, the operation 24 may optionally deposit an interfacial layer 211 over the various surfaces that are exposed in the gate trenches 205 and then deposit the FE layer 210 over the interfacial layer 211. For example, interfacial layer 211 is provided in the embodiments illustrated in FIGS. 6B, 6D, 6E, and 6F. For example, the interfacial layer 211 may increase the adhesion between the FE layer 210 and the various surfaces that are underneath the FE layer 210. The material for the interfacial layer 211 may be selected depending on the material of the semiconductor layer 204. When the semiconductor layer 204 includes an oxide semiconductor material, the interfacial layer 211 may include aluminum oxide (e.g., $Al_2O_3$), silicon oxide (e.g., $SiO_2$), hafnium oxide ($HfO_2$), lanthanum oxide ($La_2O_3$), or other suitable material in various embodiments. When the semiconductor layer 204 includes silicon, polysilicon, or another non-oxide semiconductor material, the interfacial layer 211 may include silicon oxide (e.g., $SiO_2$), a native oxide of the material included in the semiconductor layer 204, or other suitable material in various embodiments.

Figure 4H:
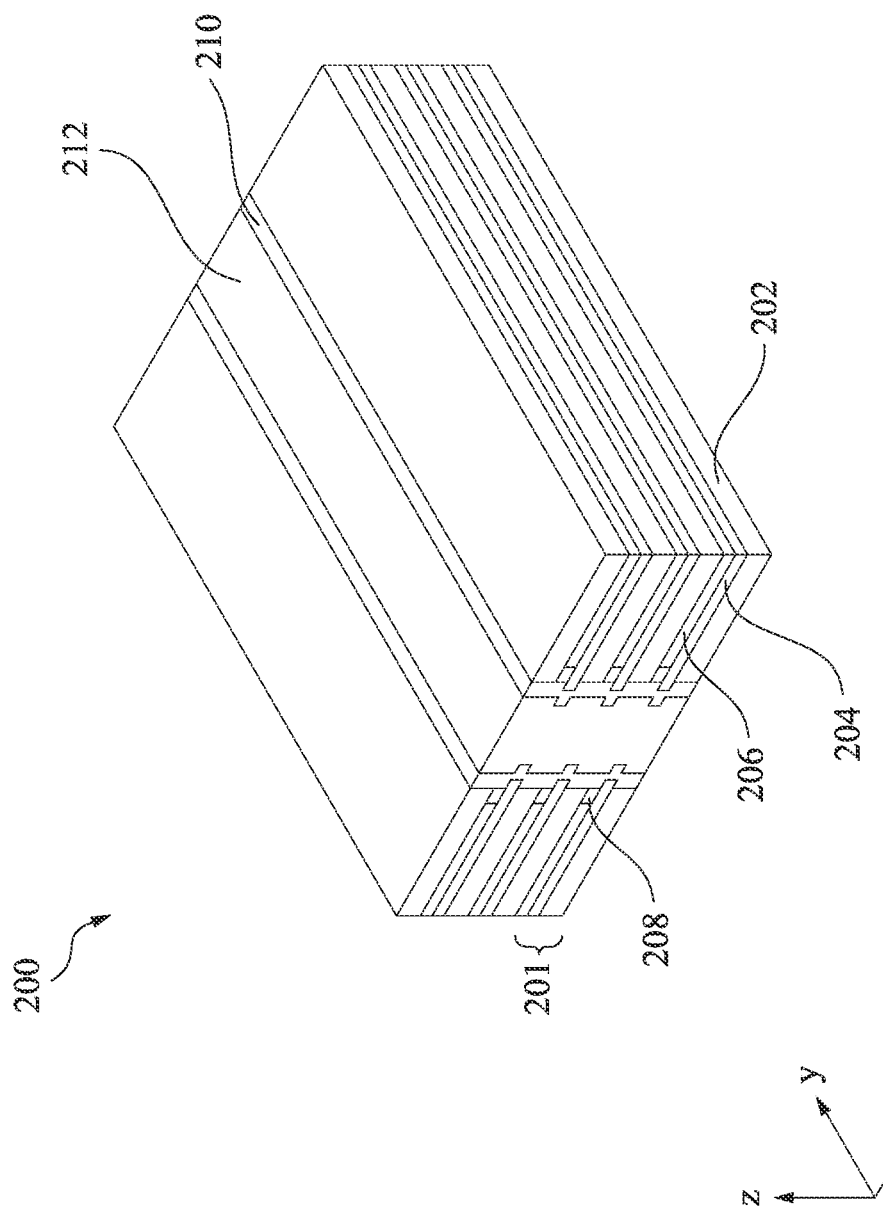
Figure 4I:
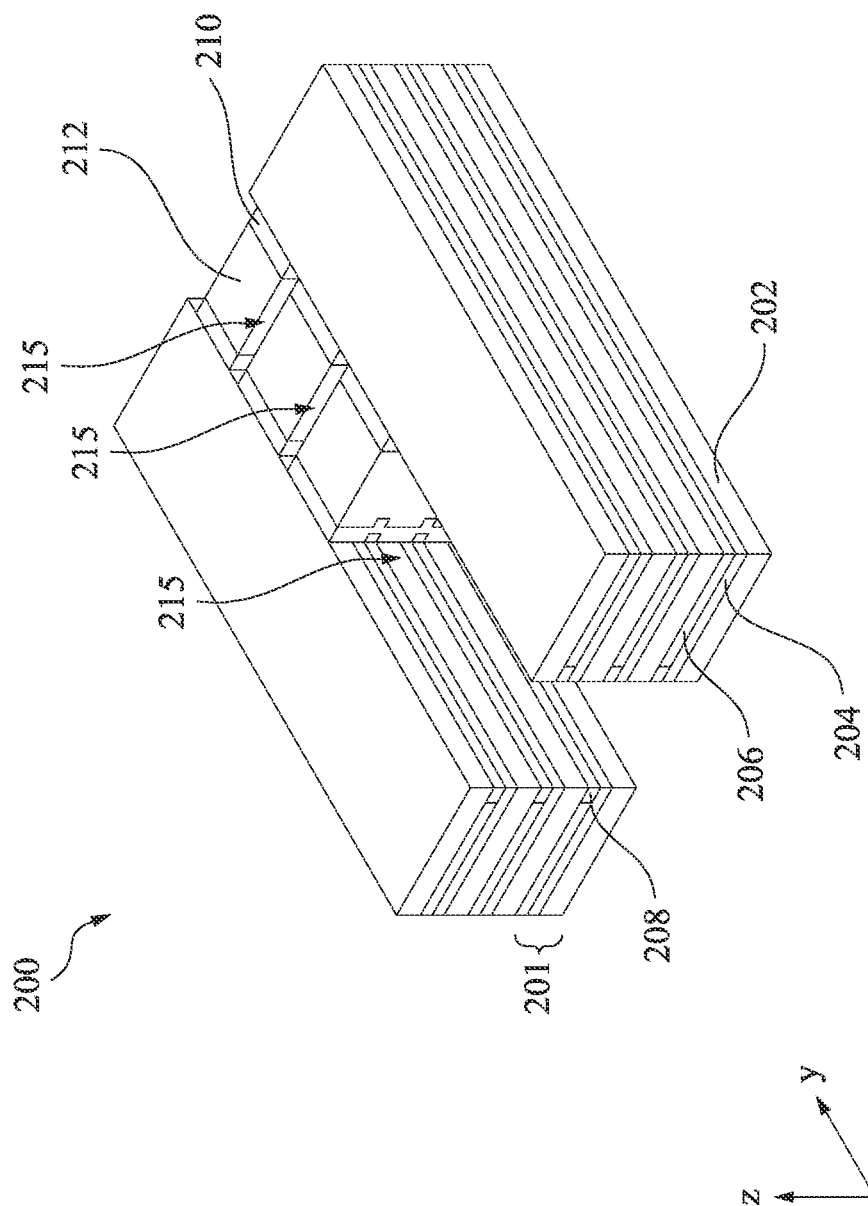

At operation 26, the method 10 (FIG. 1A) deposits one or more gate electrode layers 212 in the gate trenches 205, filling the gate trenches 205 and wrapping around the FE layer 210, such as shown in FIG. 4H. In an embodiment, the gate electrode 212 includes a p-type work function layer such as titanium nitride, tantalum nitride, ruthenium, molybdenum, tungsten, platinum, or combinations thereof. In an alternative embodiment, the gate electrode 212 includes an n-type work function layer such as titanium, aluminum, tantalum carbide, tantalum carbide nitride, tantalum silicon nitride, or combinations thereof. In some embodiments, the gate electrode 212 may include both p-type work function layer(s) and n-type work function layer(s) to achieve a desired work function. In some embodiments, the gate electrode 212 may further include a low-resistance metal such as aluminum, tungsten, cobalt, copper, and/or other suitable materials that are deposited over the p-type and/or n-type work function layer. The gate electrode 212 may be deposited using ALD, CVD, PECVD, plating, or other suitable methods.

At operation 28, the method 10 (FIG. 1A) etches the gate electrode 212 and the FE layer 210 to form gate isolation trenches 215, such as shown in 4I. As a result of operation 28, multiple stacks of unit cells 250 are formed. Operation 28 may involve multiple processes such as photolithography and etching. In an embodiment, operation 28 includes performing a photolithography process to form an etch mask (such as a structure including a resist pattern) over the structure 200, similar to the photolithography process discussed with reference to the operation 14. The etch mask provides openings corresponding to the gate isolation trenches 215. After the etch mask is formed, operation 28 etches the gate electrode 212 and the FE layer 210 through the openings in the etch mask to form the gate isolation trenches 215. Operation 28 may apply one or more etching processes that are selectively targeted at the materials of the layers 212 and 210 with no (or minimal) etching to the isolation structure 202, the semiconductor layer 204, and the inner spacer features 208. In the present embodiment, the various etching processes may include dry etching, reactive ion etching (RIE), and/or other suitable processes. After the gate isolation trenches 215 are etched, operation 28 removes the etch mask, for example, using resist stripping or other methods.

Figure 4J:
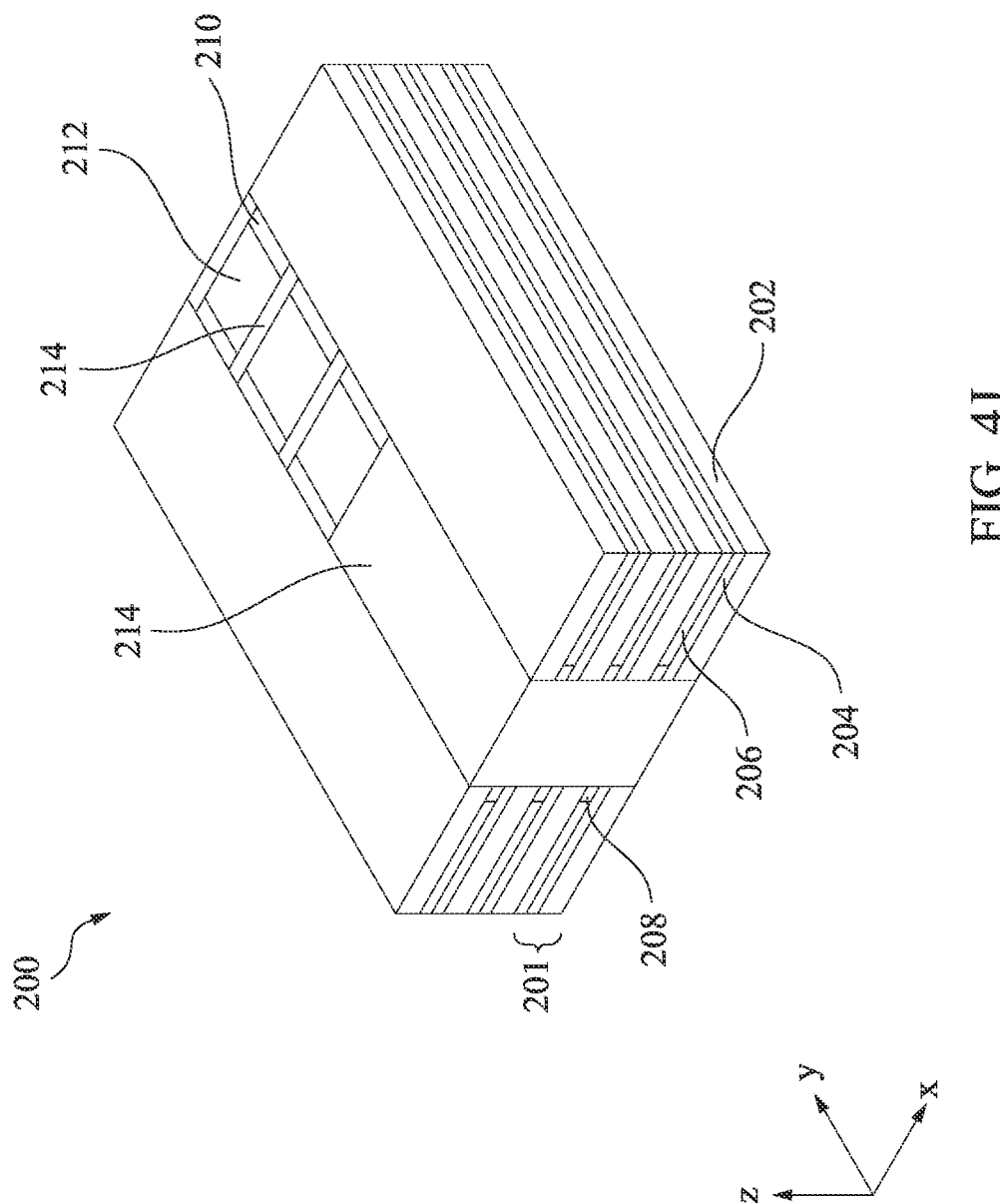

At operation 30, the method 10 (FIG. 1A) forms a gate isolation 214 in the gate isolation trenches 215, such as shown in FIG. 4J. In an embodiment, after depositing and overfilling a dielectric material in the gate isolation trenches 215, operation 30 performs a CMP process to planarize the top surface of the structure 200 and to expose the gate electrode 212. The remaining dielectric material becomes the gate isolation 214. In some embodiments, the gate isolation 214 includes a dielectric material such as silicon oxide ($SiO_2$), silicon nitride ($Si_3N_4$), silicon oxynitride (SiON), silicon oxycarbonitride (SiOCN), fluoride-doped silicate glass (FSG), a low-k dielectric material, and/or other suitable insulating material. The gate isolation 214 may be deposited using CVD, PECVD, flowable CVD, or other suitable methods in various embodiments.

Figure 4K:
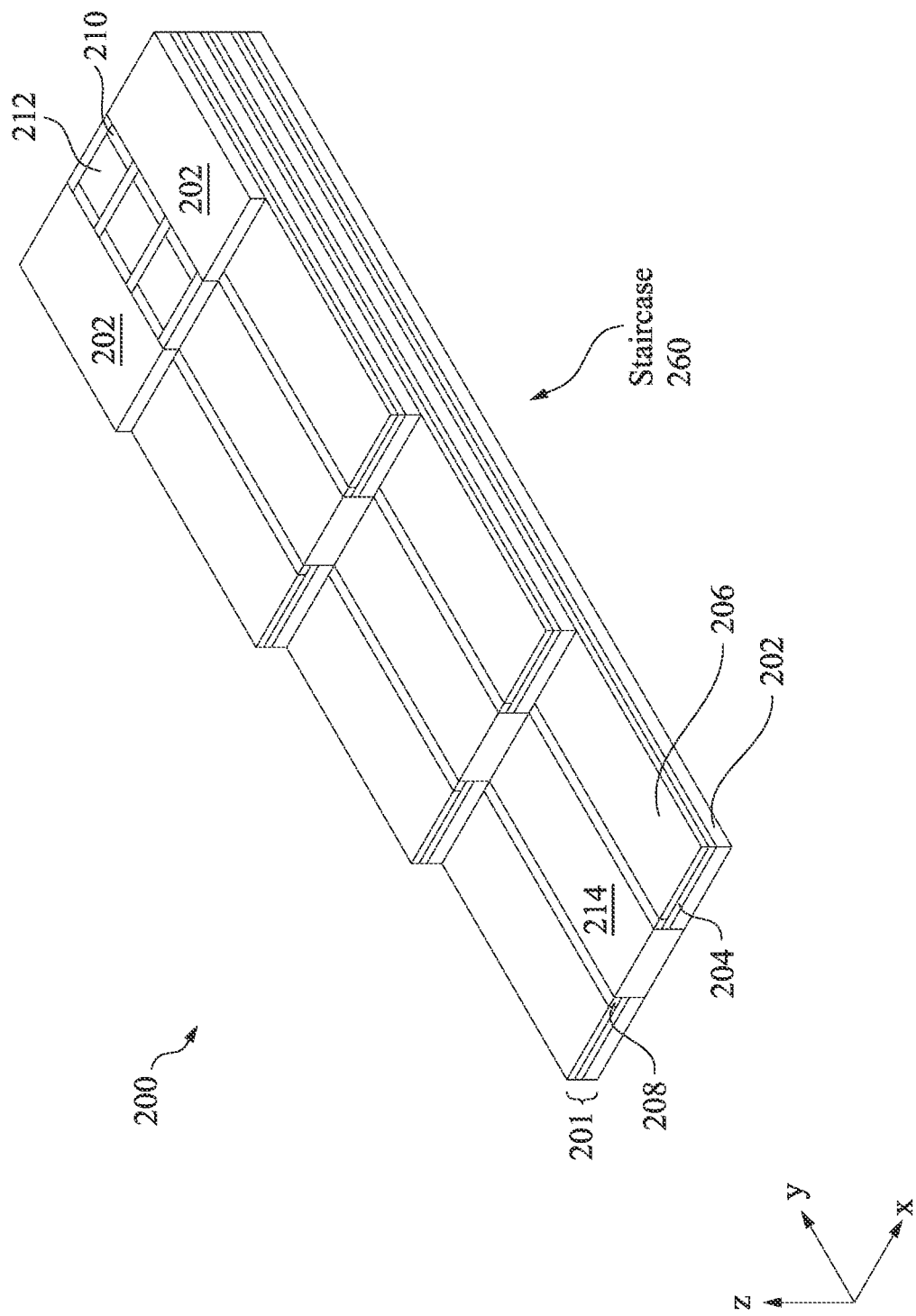

At operation 32, the method 10 (FIG. 1A) forms a staircase structure 260, such as shown in FIG. 4K. Each step in the staircase structure 260 includes one FERAM layer 201. In the center region (the channel region) of the FERAM layer 201, there are multiple channel regions 204c (see FIGS. 1A, 1B, and 1C) arranged in a column (along the "y" direction), FE layers 210 surrounding the multiple channel regions 204c respectively, gate electrodes 212 surrounding the FE layers 210 respectively, and gate isolation 214 separating and isolating the gate electrodes 212. On both sides of the center region, the FERAM layer 201 includes the isolation structure 202, the semiconductor layer 204 (source and drain regions), the inner spacer features 208, and the metal layer 206. The staircase structure 260 may be formed using multiple photolithography, etching, and trimming processes. For example, a first etch mask is formed to cover the area of the structure 200 corresponding to the topmost step of the staircase structure 260, then the structure 200 is etched until the metal layer 206 is exposed. Then, a second etch mask is formed to cover the area of the structure 200 corresponding to the topmost step and one step below the topmost step of the staircase structure 260, then the structure 200 is etched until the next metal layer 206 is exposed. This process may be repeated until the staircase structure 260 is formed. The various etching processes may include dry etching, reactive ion etching (RIE), and/or other suitable processes. The etch masks for the various etching processes may be formed using photolithography and trimming processes to achieve the desired shape.

Figure 4L:
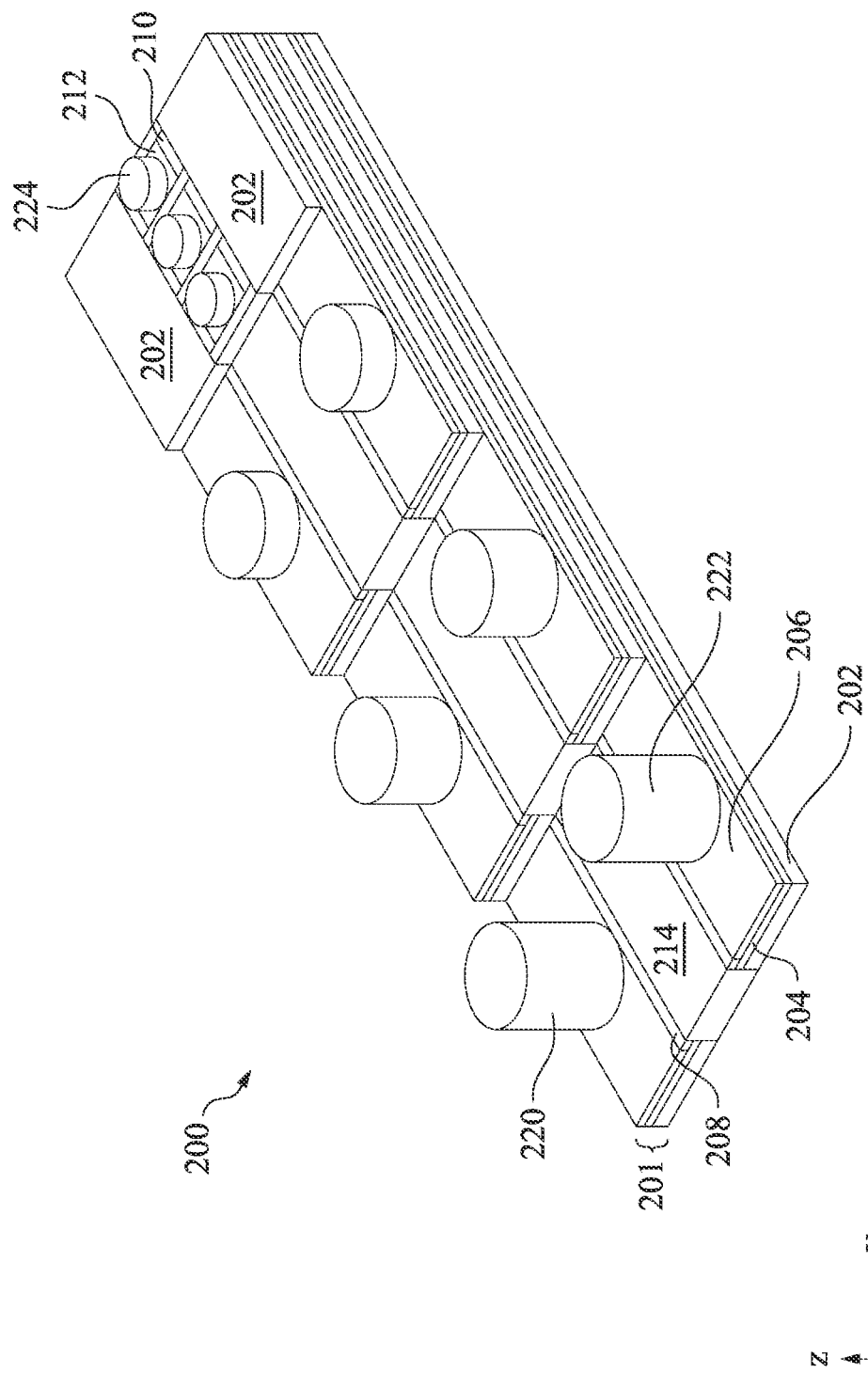

At operation 34, the method 10 (FIG. 1A) forms vias 220 and 222 to contact the metal layer 206 in the S/D regions at each step of the staircase structure 260 and form vias 224 to contact the gate electrodes 212, such as shown in FIG. 4L. In an embodiment, operation 34 includes depositing one or more dielectric layers (not shown) over the staircase structure 260; forming an etch mask (such as using a photolithography process) over the one or more dielectric layers where the etch mask provides openings corresponding to the vias 220, 222, and 224; etching via holes into the one or more dielectric layers to expose the metal layer 206 at each step of the staircase structure 260; and depositing one or more conductive materials in the via holes to form the vias 220, 222, and 224. For purpose of simplicity, the one or more dielectric layers are not shown in FIG. 4L. The one or more dielectric layers may include tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The one or more dielectric layers may be formed by PECVD (plasma enhanced CVD), FCVD (flowable CVD), or other suitable methods. The vias 220, 222, and 224 may include one or more conductive materials such as Co, W, Ru, Al, Mo, Ti, TiN, TiSi, CoSi, NiSi, TaN, Ni, TiSiN, or combinations thereof, and may be formed by ALD, CVD, PVD, plating, and/or other suitable processes.

At operation 36, the method 10 (FIG. 1A) performs further fabrication. For example, it may form interconnect layers above the FERAM structure 200. For example, the interconnect layers may include word lines (WL), bit lines (BL), and source lines (SL) that are electrically connected to the vias 224, 222, and 220 respectively. For example, FIG. 2 illustrates SL 230 and BL 232 electrically connected to the vias 220 and 222 respectively. FIG. 2 illustrates WL formed below the FERAM structure 200 in an embodiment. In an alternative embodiment (not shown), the WL may be formed above the FERAM structure 200 and electrically connected to the gate vias 224.

Figure 5A:
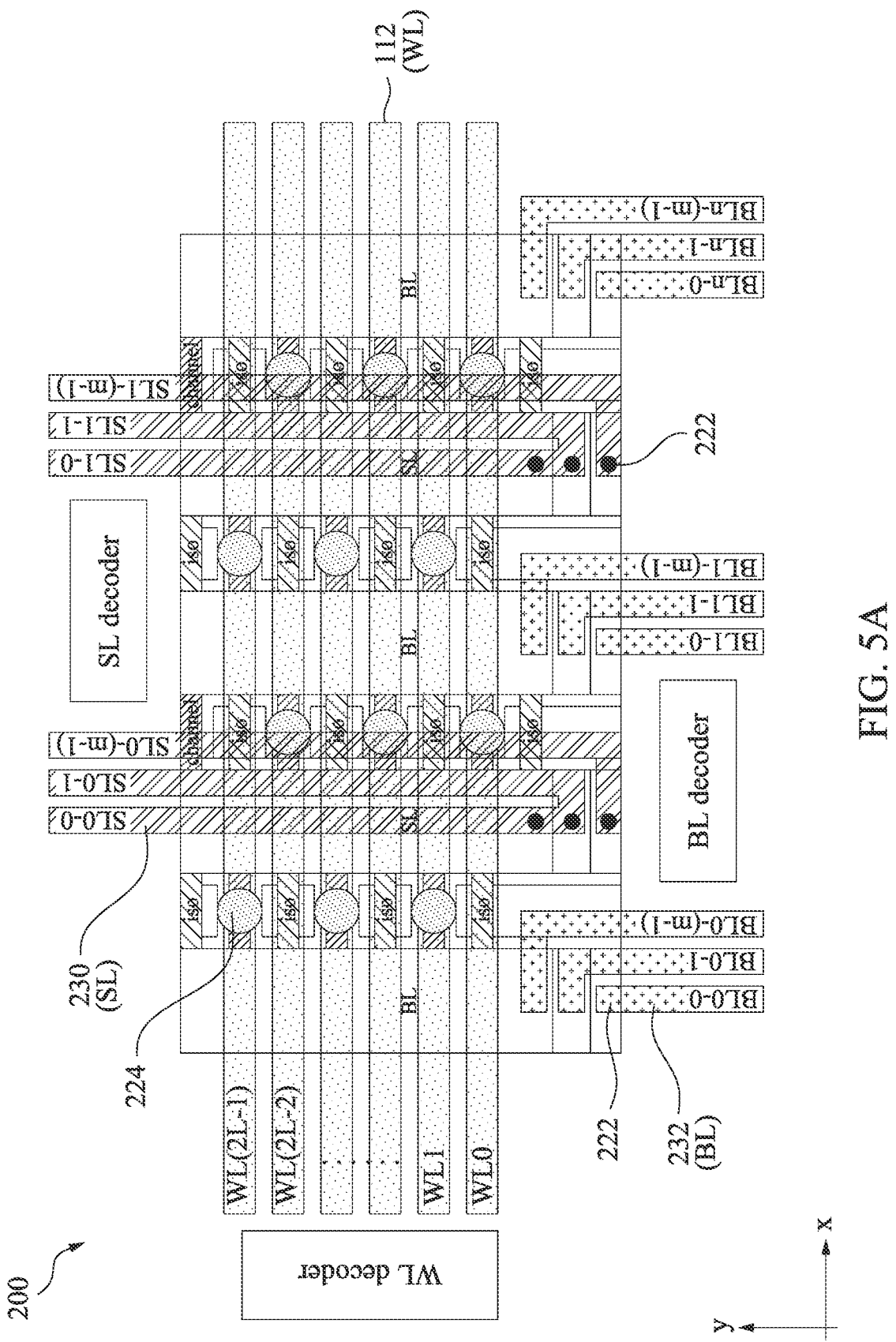
FIGS. 5A, 5B, and 5C show schematic views of a semiconductor device having a stacked FERAM structure, according to some embodiments of the present disclosure.
Figure 5B:
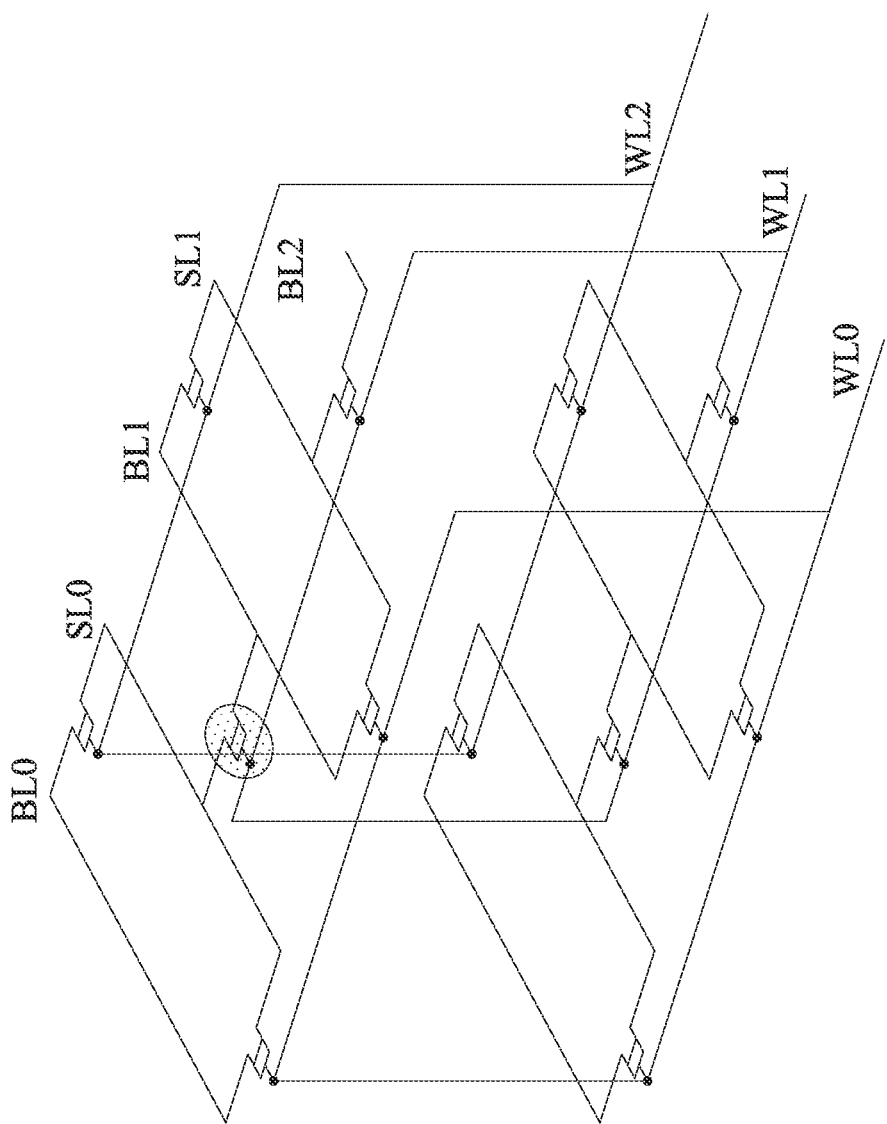
Figure 5C:
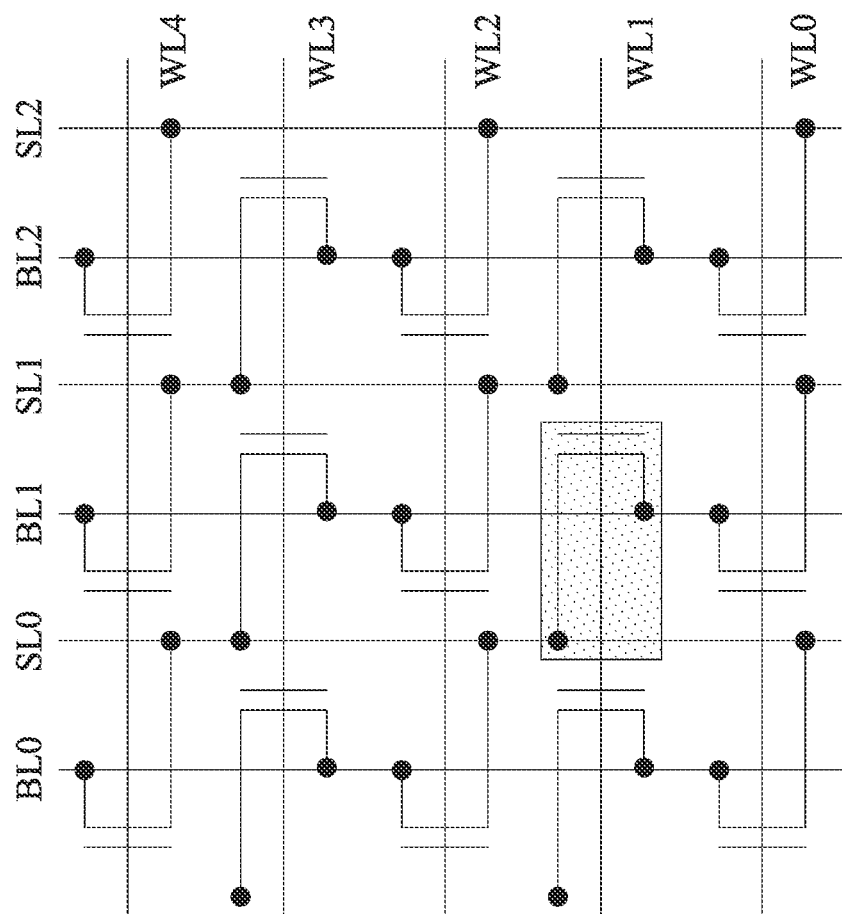

FIG. 5A illustrates a schematic top view of the FERAM structure 200 according to an embodiment. FIG. 5B illustrates a portion of a 3D equivalent circuit of the FERAM structure 200 shown in FIG. 5A, while FIG. 5C illustrates a portion of a 2D condensed circuit of the FERAM structure 200 shown in FIG. 5A. Referring to FIG. 5A, the word lines WL are oriented along the "x" direction and are connected to the gate electrodes through the vias 224. The bit lines BL and the source lines SL are oriented along the "y" direction and are connected to the source/drain features through the vias 222 and 220 respectively. In the embodiment depicted in FIG. 5A, there are m bit lines BL and m source lines SL per column of FERAM cells (for example, there are m steps in the staircase structure 260). Two columns of FERAM cells are arranged in staggered fashion and each column provides L stacks of unit cells 250 (thus, two columns provide 2L stacks of unit cells 250), where each stack of unit cells 250 is addressed by a word line WL. The word lines WL are routed to a WL decoder. The bit lines are routed to a BL decoder. The source lines are routed to a SL decoder. By controlling the WL decoder, the BL decoder, and the SL decoder, each FERAM unit cell 250 can be accessed.

FIGS. 6A, 6B, 6C, 6D, 6E, and 6F show various embodiments of a portion of the unit cell 250 that may be implemented in the MRAM 200 according to the present disclosure. Particularly, FIGS. 6A, 6B, 6C, 6D, 6E, and 6F illustrate cross-sectional schematic views of the semiconductor layer 204 (including the optional S/D 209 and the channel region 204c), the metal layer 206, the optional interfacial layer 211, the FE layer 210, and the gate electrode 212 in various configurations. These are non-limiting examples of unit cell 250 according to the present disclosure. In the embodiment shown in FIG. 6A, the FE layer 210 is directly on the semiconductor layer 204 which includes an oxide semiconductor material. This embodiment does not include S/D 209 and interfacial layer 211. In the embodiment shown in FIG. 6B, the FE layer 210 is directly on an interfacial layer 211 which is directly on the semiconductor layer 204 which includes an oxide semiconductor material. This embodiment does not include S/D 209. In the embodiment shown in FIG. 6C, the FE layer 210 is directly on the semiconductor layer 204 which includes an oxide semiconductor material. In this embodiment, the semiconductor layer 204 includes S/D 209 formed in the semiconductor layer 204. In the embodiment shown in FIG. 6D, the FE layer 210 is directly on an interfacial layer 211 which is directly on the semiconductor layer 204 which includes an oxide semiconductor material. In this embodiment, the semiconductor layer 204 includes S/D 209 formed in the semiconductor layer 204. In the embodiment shown in FIG. 6E, the FE layer 210 is directly on an interfacial layer 211 which is directly on the semiconductor layer 204 which includes polysilicon. In this embodiment, the semiconductor layer 204 includes S/D 209 formed in the semiconductor layer 204. Using polysilicon as the semiconductor material in the semiconductor layer 204 reduces the costs of making the FERAM structure 200 compared to embodiments using crystalline silicon as the semiconductor material in the semiconductor layer 204. In the embodiment shown in FIG. 6F, the FE layer 210 is directly on an interfacial layer 211 which is directly on the semiconductor layer 204 which includes silicon (such as crystalline silicon) or another suitable semiconductor material. In this embodiment, the semiconductor layer 204 includes S/D 209 formed in the semiconductor layer 204. For embodiments shown in FIGS. 6E and 6F, the interfacial layer 211 may include silicon oxide ($SiO_2$) in an embodiment. For embodiments shown in FIGS. 6A, 6B, 6C, and 6D, the semiconductor layer 204 may include indium gallium zinc oxide (IGZO), indium tungsten oxide (IWO), indium tin oxide (ITO), zinc oxide (ZnO), other suitable oxide semiconductor, or a combination thereof. For embodiments shown in FIG. 6B, the interfacial layer 211 may include aluminum oxide ($Al_2O_3$), silicon oxide ($SiO_2$), or other suitable materials in some embodiments. For embodiments shown in FIG. 6D, the interfacial layer 211 may include aluminum oxide (e.g., $Al_2O_3$), silicon oxide (e.g., $SiO_2$), hafnium oxide ($HfO_2$), lanthanum oxide ($La_2O_3$), or other suitable material in various embodiments.

Although not intended to be limiting, embodiments of the present disclosure provide one or more of the following advantages. For example, embodiments of the disclosed 3D FERAM structure enable high-density FERAM memory array. For another example, in some embodiments, the source/drain electrodes of the disclosed FERAM array are formed as part of an initial multi-layer stack before the gate electrode is formed and naturally connect all channel layers in the same row. Thus, extra process steps to form the source/drain electrodes is not required, simplifying the fabrication process. For yet another example, the dielectric inner spacers in the disclosed FERAM array reduce the coupling capacitance between the gate electrodes and the source/drain electrodes, thereby increasing the operating speed of the FERAM array.

In one example aspect, the present disclosure is directed to a device that includes a first channel; a second channel above the first channel; and a gate structure surrounding the first and second channels, wherein the gate structure includes a ferroelectric (FE) layer surrounding the first and second channels and a gate metal layer surrounding the FE layer. The device further includes two first electrodes connected to two sides of the first channel; two second electrodes connected to two sides of the second channel; a dielectric layer between the first and the second electrodes; and an inner spacer layer between the two first electrodes and the gate structure.

In some embodiments, the inner spacer layer is also between the two second electrodes and the gate structure. In an embodiment, the device further includes a gate via disposed on and connected to the gate structure; a source via disposed on and connected to one of the first electrodes; and a bit line via disposed on and connected to another one of the first electrodes. In another embodiment, the device further includes one or more transistors; and an $N^{th}$ metal layer over the one or more transistors, N being a natural number, wherein the first channel is disposed over the $N^{th}$ metal layer. In yet another embodiment, the device further includes an interfacial layer between the FE layer and each of the first and the second channels.

In an embodiment of the device, the FE layer includes $HfO_2$; $HfxZr_{1-x}O_2$; $HfO_2$ doped by Si, Y, Ge, or La; AlScN; or AlN. In another embodiment, the first and the second channels include an oxide semiconductor or polysilicon. In some embodiments, the inner spacer layer includes a dielectric material having a dielectric constant less than 10.

In an embodiment of the device, the first and the second electrodes include TiN, TaN, Ru, or W. In another embodiment of the device, the first and the second electrodes extend lengthwise along a first direction, and the first electrodes extend longer than the second electrodes.

In another example aspect, the present disclosure is directed to a device that includes a plurality of transistors; and a 3D FERAM structure above the plurality of transistors. The 3D FERAM structure includes multiple unit cells vertically stacked one over another. Each unit cell includes a semiconductor layer, a ferroelectric (FE) layer surrounding a portion of the semiconductor layer, a gate layer over the FE layer and surrounding the portion of the semiconductor layer, an isolation layer under the semiconductor layer, a metal layer over the semiconductor layer, and a dielectric spacer layer over the semiconductor layer and between the FE layer and the metal layer.

In an embodiment of the device, the dielectric spacer layer includes a dielectric material having a dielectric constant less than 10. In an embodiment, the FE layer includes $HfO_2$, $HfxZr_{1-x}O_2$, $HfO_2$ doped by Si, Y, Ge, or La, AlScN, or AlN; the metal layer includes TiN, TaN, Ru, or W; and the semiconductor layer includes an oxide semiconductor or polysilicon. In an embodiment, the device further includes an interfacial layer between the FE layer and the portion of the semiconductor layer.

In another example aspect, the present disclosure is directed to a method that includes forming a stack of multi-layers, where each multi-layer includes a first isolation layer, a semiconductor layer over the first isolation layer, and a first metal layer over the semiconductor layer. The method further includes etching the stack of multi-layers to form gate trenches in a channel region of the stack of multi-layers; removing the first isolation layers and the first metal layers from the channel region, resulting in channel portions of the semiconductor layers exposed in the gate trenches; laterally recessing the first metal layers from the gate trenches, resulting in gaps between adjacent layers of the first isolation layers and the semiconductor layers; forming an inner spacer layer in the gaps; forming a ferroelectric (FE) layer surrounding each of the channel portions of the semiconductor layers and over sidewalls of the gate trenches, wherein the inner spacer layer is disposed laterally between the FE layer and the first metal layers; and depositing a metal gate layer over the FE layer and filling the gate trenches.

In an embodiment of the method, the forming of the inner spacer layer includes depositing a dielectric material surrounding the channel portions of the semiconductor layers and filling the gaps; and etching the dielectric material such that the dielectric material is removed from outer surfaces of the channel portions of the semiconductor layers but at least a portion of the dielectric material remains in the gaps, wherein the portion of the dielectric material remaining in the gaps becomes the inner spacer layer.

In an embodiment, the method further includes etching the metal gate layer and the FE layer to form metal gates separated by isolation trenches and filling the isolation trenches with a second isolation layer. In a further embodiment, the method includes etching the second isolation layer and the stack of multi-layers to form a staircase structure having multiple steps one over another, each step including a portion of the second isolation layer, two portions of the inner spacer layer adjacent to an upper section of the portion of the second isolation layer, and two portions of one of the multi-layers sandwiching both the portion of the second isolation layer and the two portions of the inner spacer layer. In a further embodiment, the method includes forming vias on the first metal layer at each of the multiple steps. In some embodiments of the method, the inner spacer layer includes a dielectric material having a dielectric constant less than 10.

In yet another example aspect, the present disclosure is directed to a method that includes forming a stack of multi-layers where each multi-layer includes a first isolation layer, a semiconductor layer over the first isolation layer, and a first metal layer over the semiconductor layer; forming gate trenches in a channel region of the stack of multi-layers, wherein channel portions of the semiconductor layers are exposed in the gate trenches; laterally recessing the first metal layers from the gate trenches, resulting in gaps between adjacent layers of the first isolation layers and the semiconductor layers; forming an inner spacer layer in the gaps; forming a ferroelectric (FE) layer surrounding each of the channel portions of the semiconductor layers and over sidewalls of the gate trenches, wherein the inner spacer layer is disposed laterally between the FE layer and each of the first metal layers; and forming metal gates over the FE layer, wherein each of the metal gates engages multiple of the channel portions of the semiconductor layers that are disposed one over another.

In an embodiment of the method, the forming of the gate trenches includes etching the stack of multi-layers in a channel region of the stack of multi-layers by a first etching process, resulting in gate trenches; and removing the first isolation layers and the first metal layers from the channel region by a second etching process different from the first etching process, resulting in the channel portions of the semiconductor layers exposed in the gate trenches.

In an embodiment of the method, the forming of the inner spacer layer includes: depositing a dielectric material surrounding the channel portions of the semiconductor layers and filling the gaps; and etching the dielectric material such that the dielectric material is removed from the channel portions of the semiconductor layers but at least a portion of the dielectric material remains in the gaps, wherein the portion of the dielectric material remaining in the gaps becomes the inner spacer layer.

In an embodiment of the method, the forming of the metal gates includes: depositing one or more metal gate layers over the FE layer and filling the gate trenches; etching the one or more metal gate layers and the FE layer to form the metal gates separated by isolation trenches; and filling the isolation trenches with a second isolation layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a stack of multi-layers, each multi-layer including a first isolation layer, a semiconductor layer over the first isolation layer, and a first metal layer over the semiconductor layer;
   etching the stack of multi-layers to form gate trenches in a channel region of the stack of multi-layers;
   removing the first isolation layers and the first metal layers from the channel region, resulting in channel portions of the semiconductor layers exposed in the gate trenches;
   laterally recessing the first metal layers from the gate trenches, resulting in gaps between adjacent layers of the first isolation layers and the semiconductor layers;
   forming an inner spacer layer in the gaps;
   forming a ferroelectric (FE) layer surrounding each of the channel portions of the semiconductor layers and over sidewalls of the gate trenches, wherein the inner spacer layer is disposed laterally between the FE layer and the first metal layers; and
   depositing a metal gate layer over the FE layer and filling the gate trenches.

2. The method of claim 1, wherein the forming of the inner spacer layer includes:
   depositing a dielectric material surrounding the channel portions of the semiconductor layers and filling the gaps; and
   etching the dielectric material such that the dielectric material is removed from outer surfaces of the channel portions of the semiconductor layers but at least a portion of the dielectric material remains in the gaps, wherein the portion of the dielectric material remaining in the gaps becomes the inner spacer layer.

3. The method of claim 1, further comprising:
   etching the metal gate layer and the FE layer to form metal gates separated by isolation trenches; and
   filling the isolation trenches with a second isolation layer.

4. The method of claim 3, further comprising:
   etching the second isolation layer and the stack of multi-layers to form a staircase structure having multiple steps one over another, each step including a portion of the second isolation layer and two portions of the inner spacer layer.

5. The method of claim 4, further comprising:
   forming vias on each of the first metal layers at each of the multiple steps.

6. The method of claim 1, wherein the inner spacer layer includes a dielectric material having a dielectric constant less than 10.

7. The method of claim 1, wherein the stack of multi-layers is formed in one of interconnect layers above a plurality of transistors.

8. The method of claim 1, wherein the FE layer includes $HfO_2$, $Hf_xZ_{1-x}O_2$, $HfO_2$ doped by Si, Y, Ge, or La, AlScN, or AlN, each of the first metal layers includes TiN, TaN, Ru, or W, and each of the semiconductor layers includes an oxide semiconductor or polysilicon.

9. The method of claim 1, wherein each of the semiconductor layers includes a source region and a drain region on two sides of the channel region, the source regions in different ones of the semiconductor layers are vertically stacked one over another, and the drain regions in different ones of the semiconductor layers are vertically stacked one over another.

10. A method, comprising:
    forming a stack of multi-layers in an interconnect layer over a plurality of transistors, each multi-layer including a first isolation layer, a semiconductor layer over the first isolation layer, and a first metal layer over the semiconductor layer;
    etching the stack of multi-layers to form a gate trench and channel layers suspended in the gate trench, wherein the channel layers are portions of the semiconductor layers in the stack of multi-layers;
    laterally recessing the first metal layers within the gate trenches, resulting in gaps between adjacent layers of the first isolation layers and the semiconductor layers;
    forming an inner spacer layer in the gaps; and
    forming a gate structure in the gate trench, wherein the gate structure includes a ferroelectric (FE) layer surrounding each of the channel layers and a metal gate layer over the FE layer, wherein the inner spacer layer is disposed laterally between the FE layer and each of the first metal layers.

11. The method of claim 10, wherein the etching of the stack of multi-layers to form the gate trench and the channel layers includes:
    vertically etching the stack of multi-layers to form the gate trench in a channel region of the stack of multi-layers; and
    after the vertically etching, laterally etching the first isolation layers and the first metal layers within the gate trench, resulting in the channel layers suspended in the gate trench.

12. The method of claim 10, wherein the forming of the inner spacer layer in the gaps includes:
    depositing a dielectric material surrounding the channel layers and filling the gaps; and
    etching back the dielectric material such that the dielectric material only remains in the gaps.

13. The method of claim 10, further comprising:
    etching the gate structure to form a gate isolation trench; and
    filling the gate isolation trench with a second isolation layer, wherein the second isolation layer laterally isolates a first portion of the gate structure from a second portion of the gate structure, and each of the first and the second portions of the gate structure engages multiple ones of the channel layers.

14. The method of claim 13, further comprising:
    forming a first gate via disposed on the first portion of the gate structure; and
    forming a second gate via disposed on the second portion of the gate structure.

15. The method of claim 10, wherein each of the semiconductor layers includes a source region and a drain region, the source regions in different ones of the semiconductor layers are vertically stacked one over another, and the drain regions in different ones of the semiconductor layers are vertically stacked one over another.

16. The method of claim 10, wherein the FE layer includes $HfO_2$, $Hf_xZ_{1-x}O_2$, $HfO_2$ doped by Si, Y, Ge, or La, AlScN, or AlN, each of the first metal layers includes TiN, TaN, Ru, or W, each of the semiconductor layers includes an oxide semiconductor or polysilicon, and the inner spacer layer includes a dielectric material having a dielectric constant less than 10.

17. A method, comprising:

forming a stack of multi-layers, each multi-layer including a first isolation layer, a semiconductor layer over the first isolation layer, and a first metal layer over the semiconductor layer;

etching the stack of multi-layers to form a gate trench and channel layers suspended in the gate trench, wherein the channel layers are portions of the semiconductor layers in the stack of multi-layers;

laterally recessing the first metal layers from the gate trench, resulting in gaps between adjacent layers of the first isolation layers and the semiconductor layers;

forming an inner spacer layer in the gaps;

forming a ferroelectric (FE) layer surrounding each of the channel layers;

depositing a metal gate layer over the FE layer and in the gate trench;

etching gate isolation trenches; and forming gate isolation structures in the gate isolation trenches.

18. The method of claim 17, wherein, after the etching of the stack of multi-layers, each of the semiconductor layers in the stack of multi-layers includes a source region, a drain region, and multiple ones of the channel layers connecting the source region to the drain region, and wherein the multiple ones of the channel layers are spaced laterally one from another.

19. The method of claim 17, wherein the forming of the inner spacer layer includes:

depositing a dielectric material surrounding the channel layers and filling the gaps, wherein the dielectric material has a dielectric constant less than 10; and etching back the dielectric material such that the dielectric material only remains in the gaps and becomes the inner spacer layer.

20. The method of claim 17, wherein the gate isolation structures laterally isolate a first portion of the metal gate layer from a second portion of the metal gate layer, and each of the first and the second portions of the metal gate layer surrounds multiple ones of the channel layers.

* * * * *